US012805039B2

(12) United States Patent
Chung et al.

(10) Patent No.: US 12,805,039 B2
(45) Date of Patent: Nov. 17, 2026

(54) IMAGE SENSOR INCLUDING UNIT PIXEL REGIONS WITH TRANSFER GATE ELECTRODES HAVING ANGLED EXTENDING PARTS

(71) Applicant: SAMSUNG ELECTRONICS CO., LTD., Suwon-si (KR)

(72) Inventors: Young Woo Chung, Suwon-si (KR); Do Hoon Kim, Suwon-si (KR); Sung-Jun Kim, Suwon-si (KR); Han Seok Kim, Suwon-si (KR); Jin Hyung Roh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 344 days.

(21) Appl. No.: 18/642,333

(22) Filed: Apr. 22, 2024

(65) Prior Publication Data

US 2025/0098345 A1 Mar. 20, 2025

(30) Foreign Application Priority Data

Sep. 18, 2023 (KR) ........................ 10-2023-0123603

(51) Int. Cl.

| | |
|---|---|
| ***H10F 39/00*** | (2025.01) |
| ***H10F 39/12*** | (2025.01) |
| ***H10F 39/18*** | (2025.01) |

(52) U.S. Cl.

CPC ..... *H10F 39/80373* (2025.01); *H10F 39/014* (2025.01); *H10F 39/182* (2025.01); *H10F 39/199* (2025.01); *H10F 39/802* (2025.01); *H10F 39/8053* (2025.01); *H10F 39/8063* (2025.01); *H10F 39/807* (2025.01); *H10F 39/809* (2025.01); *H10F 39/811* (2025.01)

(58) Field of Classification Search

CPC ............. H10F 39/80373; H10F 39/812; H10F 39/802; H10D 64/513; H10D 64/025–027; H10D 30/0297; H10D 30/668; H10D 30/658; H10D 30/699

See application file for complete search history.

(56) References Cited

U.S. PATENT DOCUMENTS

| | | | |
|---|---|---|---|
| 11,302,727 | B2 | 4/2022 | Zang et al. |
| 11,437,420 | B2 | 9/2022 | Hung et al. |
| 11,621,336 | B2 | 4/2023 | Zang et al. |
| 11,637,137 | B2 | 4/2023 | Lee et al. |

(Continued)

*Primary Examiner* — Younes Boulghassoul

(74) *Attorney, Agent, or Firm* — Sughrue Mion, PLLC

(57) ABSTRACT

An image sensor includes a substrate; a plurality of unit pixel regions in the substrate, each unit pixel region o including a floating diffusion region and a transfer gate electrode; and a microlens on the substrate. The transfer gate electrode includes a first connection part on a first surface of the substrate and a first extending part connected to the first connection part and extending from the first surface into the substrate. A third surface of the first extending part has a first angle with respect to the first surface of the substrate and a fourth surface of the first extending part has a second angle with respect to the first surface of the substrate. The fourth surface, the third surface, and the floating diffusion region are sequentially disposed in a direction parallel to the first surface of the substrate, and the first angle is greater than the second angle.

18 Claims, 33 Drawing Sheets

(56) References Cited

U.S. PATENT DOCUMENTS

| | | | | |
|---|---|---|---|---|
| 2015/0155328 | A1* | 6/2015 | Park | H10F 39/182 257/292 |
| 2021/0313365 | A1 | 10/2021 | Takahashi | |
| 2022/0130886 | A1 | 4/2022 | Zang et al. | |
| 2022/0149088 | A1* | 5/2022 | Im | H10F 39/024 |
| 2022/0336506 | A1* | 10/2022 | Lee | H10F 39/802 |
| 2023/0044820 | A1* | 2/2023 | Park | H10F 39/80373 |
| 2023/0079156 | A1* | 3/2023 | Chen | H10F 39/026 257/291 |
| 2023/0197740 | A1* | 6/2023 | Lee | H10F 39/802 257/432 |
| 2024/0204031 | A1* | 6/2024 | Lee | H10F 39/014 |
| 2025/0194273 | A1* | 6/2025 | Fukui | H10F 39/8033 |

* cited by examiner

IMAGE SENSOR INCLUDING UNIT PIXEL REGIONS WITH TRANSFER GATE ELECTRODES HAVING ANGLED EXTENDING PARTS

CROSS-REFERENCE TO RELATED APPLICATION

This application claims priority from Korean Patent Application No. 10-2023-0123603 filed on Sep. 18, 2023 in the Korean Intellectual Property Office, and all the benefits accruing therefrom under 35 U.S.C. 119, the contents of which in its entirety are herein incorporated by reference.

BACKGROUND

1. Field of the Disclosure

Example embodiments of the disclosure relate to an image sensor.

2. Description of the Related Art

An image sensing device is one of semiconductor elements that convert optical information into an electric signal. Such an image sensing device may include a charge coupled device (CCD) image sensing device and a complementary metal-oxide semiconductor (CMOS) image sensing device.

The CMOS image sensor may be abbreviated as a CIS (CMOS image sensor). The CIS may include a plurality of pixels arranged two-dimensionally. Each of the pixels may include, for example, a photodiode PD. The photodiode may serve to convert incident light into electrical signals.

Recently, with the development of the computer industry and the telecommunication industry, a demand for an image sensing device with improved performance and a decreased size have increased in various fields, such as a digital camera, a video camera, a smart phone, a game console, a security camera, a medical micro camera, and a robot. Researches on highly scaled and highly integrated semiconductor elements in the image sensing device are being conducted accordingly, and these semiconductor elements may have fine widths and be spaced apart at fine pitches.

SUMMARY

Aspects of example embodiments of the present disclosure provide an image sensor having improved performance and reliability.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of an example embodiment, there is provided an image sensor comprises a substrate including a first surface and a second surface opposite to the first surface, a plurality of unit pixel regions provided in the substrate, each unit pixel region of the plurality of unit pixel regions including a photoelectric conversion layer, a floating diffusion region and a transfer gate electrode, and a microlens on the second surface of the substrate, wherein the transfer gate electrode comprises a first connection part on the first surface and a first extending part connected to the first connection part and extending from the first surface into the substrate, and the first extending part comprises a third surface and a fourth surface facing the third surface, wherein the third surface has a first angle with respect to the first surface of the substrate and the fourth surface has a second angle with respect to the first surface of the substrate, wherein the fourth surface, the third surface, and the floating diffusion region are sequentially disposed in a first direction parallel to the first surface of the substrate, and the first angle is greater than the second angle.

According to an aspect of an example embodiment, there is provided an image sensor comprises a substrate including a first surface and a second surface opposite to the first surface, a first unit pixel region provided in the substrate, wherein the first unit pixel region includes a photoelectric conversion layer, a floating diffusion region, and a transfer gate electrode, a second unit pixel region, a pixel separation pattern between the first unit pixel region and the second unit pixel region and a microlens on the second surface of the substrate, wherein the transfer gate electrode comprises a first extending part extending from the first surface into the substrate and a second extending part extending from the first surface into the substrate, and the first extending part comprises a third surface and a fourth surface facing the third surface, wherein the third surface has a first angle with respect to the first surface of the substrate and the fourth surface has a second angle with respect to the first surface of the substrate, and the second extending part comprises a fifth surface and a sixth surface facing the fifth surface, wherein the fifth surface has a third angle with respect to the first surface of the substrate and the sixth surface has a fourth angle with respect to the first surface of the substrate, wherein the first angle is different from the second angle, and the third angle is different from the fourth angle.

BRIEF DESCRIPTION OF THE DRAWINGS

The above and other aspects and features of the present disclosure will become more apparent by describing in detail example embodiments thereof with reference to the following drawings.

DETAILED DESCRIPTION

Hereinafter, some example embodiments of the present disclosure will be described in more detail with reference to the accompanying drawings.

Although terms such as first and second are used to describe various elements or components in the present specification, it should be noted that these elements or components are not limited by these terms. These terms are only used to distinguish a single element or component from other elements or components. Therefore, a first element or component referred to below may be a second element or component within the inventive concept of the present disclosure.

In the disclosure, the articles "a" and "an" are intended to include one or more items, and may be used interchangeably with "one or more." Where only one item is intended, the term "one" or similar language is used. For example, the term "a processor" may refer to either a single processor or multiple processors. When a processor is described as carrying out an operation and the processor is referred to perform an additional operation, the multiple operations may be executed by either a single processor or any one or a combination of multiple processors.

Reference throughout the present disclosure to "one embodiment," "an embodiment," "an example embodiment," or similar language may indicate that a particular feature, structure, or characteristic described in connection with the indicated embodiment is included in at least one embodiment of the present solution. Thus, the phrases "in one embodiment", "in an embodiment," "in an example embodiment," and similar language throughout this disclosure may, but do not necessarily, all refer to the same embodiment. The embodiments described herein are example embodiments, and thus, the disclosure is not limited thereto and may be realized in various other forms. It will also be appreciated that one or more features included in one embodiment can be combined with one or more features included in other embodiments.

Figure 1:
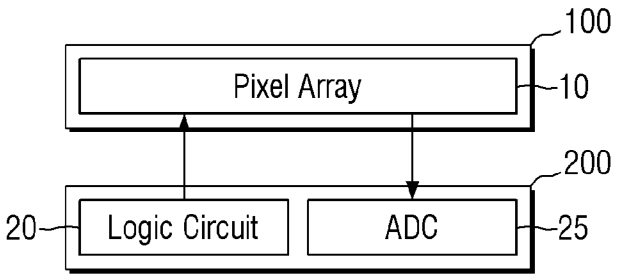
FIG. 1 is an example block diagram of an image sensor according to some example embodiments.
Figure 2:
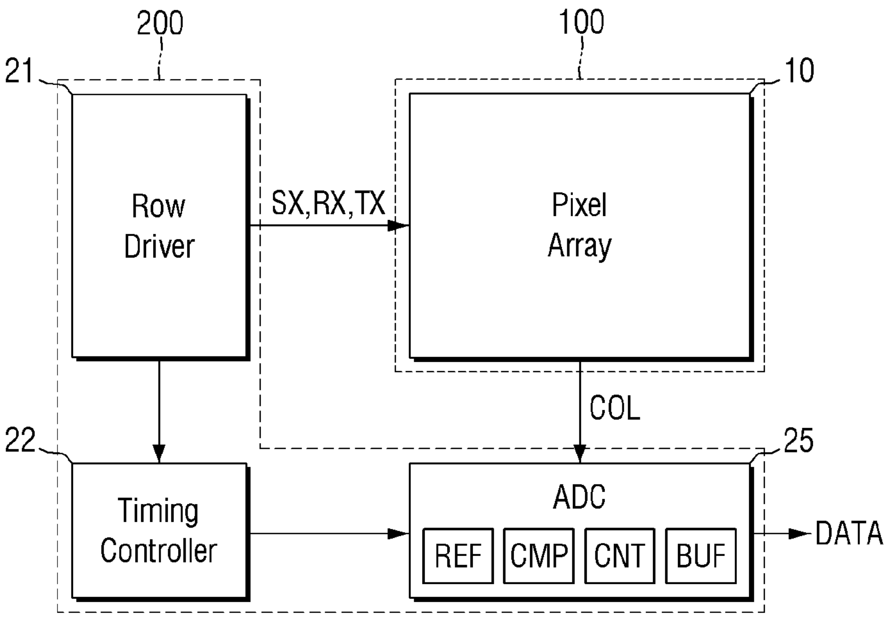
FIG. 2 is a block diagram for explaining a pixel array, a logic circuit, and an ADC of FIG. 1.

FIG. 1 is an example block diagram of an image sensor according to some example embodiments. FIG. 2 is a block diagram for explaining a pixel array, a logic circuit, and an analog to digital converter (ADC) of FIG. 1.

Referring to FIG. 1, the image sensor according to some embodiments may include a first semiconductor chip 100 and a second semiconductor chip 200. The first semiconductor chip 100 and the second semiconductor chip 200 may be positioned to overlap each other from a planar viewpoint. The first semiconductor chip 100 and the second semiconductor chip 200 may be stacked in a vertical direction.

Although not shown, the image sensor according to some embodiments may further include one or more third semiconductor chips. As an example, the third semiconductor chip may include, but not limited to, a memory cell array. The first to third semiconductor chips may be sequentially stacked in the vertical direction.

The first semiconductor chip 100 may include a pixel array 10. The second semiconductor chip 200 may include a logic circuit 20 and an analog to digital converter (ADC) 25. The pixel array 10 may generate electric charges in proportion to the amount of light that enters the pixel array 10. Furthermore, the pixel array 10 may convert optical signals into electrical signals, that is, analog signals, under the control of the logic circuit 20. The pixel array 10 may output analog signals to the ADC 25. The ADC 25 may convert the analog signals to digital signals. The ADC 25 may provide data based on digital signals.

Although not shown, the image sensor according to some embodiments may further include a memory cell array within the second semiconductor chip 200. The memory cell array may store data based on digital signals.

The data may be image data generated in a unit of a frame. A number of bits of data may be determined based on a resolution of the ADC 25. The number of bits of data may be determined based on a high dynamic range (HDR) supported by the image sensor. Further, the bits of data may further include at least one extension bit representing a generation position of data, information of data, and the like.

In some embodiments, the second semiconductor chip 200 may further include an embedded processor, such as an image signal processor (ISP) or a digital signal processor (DSP) that processes data that are output from the pixel array 10. The processor may improve noise of the image data, correct the image, and/or perform subsequent tasks related to the image that is output from the pixel array 10.

Next, referring FIG. 2, the pixel array 10 may be implemented on the first semiconductor chip 100, and the logic circuit (20 of FIG. 1) may be implemented on the second semiconductor chip 200.

The pixel array 10 may convert incident light to generate electrical signals. The pixel array 10 may include unit pixel regions provided in a form of a matrix along a row direction and a column direction. The pixel array 10 may be driven under the control of the logic circuit 20. Specifically, the logic circuit 20 may control a plurality of transistors included in the pixel array 10.

The logic circuit 20 may efficiently receive data from the pixel array 10 and generate image frames. For example, the logic circuit 20 may use a global shutter type in which an entire unit pixel regions are detected at the same time, a flutter shutter type in which an exposure time when the entire unit pixel regions are detected at the same time is adjusted, a rolling shutter type or a coded rolling shutter type of controlling the unit pixel regions in a unit of a row, or the like. The logic circuit 20 may include a row driver 21, a timing controller, and an ADC 25.

The row driver 21 may control the pixel array 10 in a unit of a row under the control of the timing controller 22. The row driver 21 may select at least one of rows of the pixel array 10 according to a row address. The row driver 21 may decode the row address and may be connected to a selection transistor AX, a reset transistor RX, and a source follower transistor SX. The pixel array 10 may be driven by a plurality of drive signals, such as a pixel selection signal, a reset signal, and a charge transfer signal, received from the row driver 21.

The ADC 25 may be connected to the pixel array 10 through a column line COL. The ADC 25 may convert analog signals received from the pixel array 10 through the column lines COL into digital signals. A number of ADCs 25 may be determined based on a number of unit pixel regions arranged along one row, and a number of column lines COL. There may be at least one or more ADCs 25, but the number thereof is not limited thereto.

For example, the ADC 25 may include a reference signal generator REF, a comparator CMP, a counter CNT, and a buffer BUF. The reference signal generator REF may generate a ramp signal having a specific slope, and provide the ramp signal as a reference signal for the comparator CMP. The comparator CMP may compare the analog signal with the ramp signal of the reference signal generator REF and output comparison signals having respective transition points of valid signal components. The counter CNT may perform a counting operation to generate a counting signal and provide the counting signal to the buffer BUF. The buffer BUF may include latch circuits connected to each column line COL, latch the counting signal output from the counter CNT for each column in response to a transition of the comparison signal, and output the latched counting signal as data.

In some embodiments, the logic circuit 20 may further include correlated double sampling (CDS) circuits that perform correlated double sampling by obtaining a difference between a reference voltage representing a reset state of the unit pixel region and an output voltage representing a signal component corresponding to the incident light, and output an analog sampling signal corresponding to the valid signal component. The correlated double sampling circuits may be connected to the column lines COL.

The timing controller 22 may control operation timings of the row driver 21 and the ADC 25. The timing controller 22 may provide timing and control signals to the row driver 21 and the ADC 25. More specifically, the timing controller 22 may control the ADC 25, and the ADC 25 may provide data to the logic circuit 20 under the control of the timing controller 22. Furthermore, the timing controller 22 may further include circuits that provide requests, commands and/or addresses to the logic circuit 20 so that the data of the ADC 25 are stored in the memory cell array.

Figure 3:
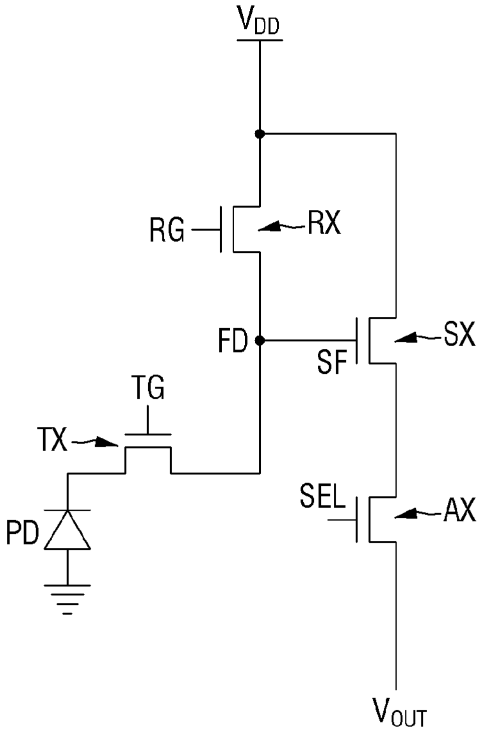
FIG. 3 is a circuit diagram for explaining a unit pixel region of the pixel array of FIG. 1.

FIG. 3 is a circuit diagram for explaining a unit pixel region of the pixel array of FIG. 1. For example, FIG. 3 may be a four-transistor (4T) structure of the unit pixel region that forms the pixel array.

Referring to FIG. 3, the pixel array may include a photoelectric conversion layer PD, a transfer transistor TX, a floating diffusion region FD, a reset transistor RX, a source follower transistor SX, and a selection transistor AX.

The photoelectric conversion layer PD may generate charges in proportion to the amount of light incident from the outside. The photoelectric conversion layer PD may be a photodiode including an n-type impurity region and a p-type impurity region. The photoelectric conversion layer PD may be coupled to the transfer transistor TX that transfers generated and accumulated charges to the floating diffusion region FD. Since the floating diffusion region FD is a region that switches charges to a voltage, and has a parasitic capacitance, the charges may be cumulatively stored.

One end of the transfer transistor TX may be connected to one of the photoelectric conversion layer PD, and the other end of the transfer transistor TX may be connected to the floating diffusion region FD. The transfer transistor TX may be formed of a transistor driven by a predetermined bias, for example, transfer signals. The transfer signals may be applied through a transfer gate TG of the transfer transistor TX. That is, the transfer transistor TX may transfer the charges generated from the photoelectric conversion layer PD to the floating diffusion region FD according to the transfer signals.

The source follower transistor SX may amplify a change in electric potential of the floating diffusion region FD that has received the charges from the photoelectric conversion layer PD, and output the amplified change to an output line $V_{OUT}$. When the source follower transistor SX is turned on, a predetermined electric potential, for example, a power supply voltage VDD, provided to a drain of the source follower transistor SX may be sent to a drain region of the selection transistor AX. A source follower gate SF of the source follower transistor SX may be connected to the floating diffusion region FD.

The selection transistor AX may select a unit pixel region to be read out in a unit of a row. The selection transistor AX may be a transistor that is driven by a selection line for applying a predetermined bias, for example a row selection signal. The row selection signal may be applied through a selection gate SEL of the selection transistor AX.

The reset transistor RX may periodically reset the floating diffusion region FD. The reset transistor RX may be a transistor that is driven by a reset line for applying a predetermined bias, for example, a reset signal. The reset signal may be applied through reset gate RG of the reset transistor RX. When the reset transistor RX is turned on by the reset signal, a predetermined electrical potential provided to the drain of the reset transistor RX, for example, the power supply voltage VDD, may be sent to the floating diffusion region FD.

While FIG. 3 shows a form in which one floating diffusion region FD is electrically connected to one transfer transistor TX, the inventive concept of the present disclosure is not limited thereto. For example, one floating diffusion region FD may be electrically connected to a plurality of transfer transistors TX. The degree of integration of image sensors according to some embodiments may be improved accordingly.

Unlike the example embodiment described above, while the area of the unit pixel region decreases, the photoelectric conversion layer PD and the transfer transistor TX may be formed on one semiconductor chip, and the reset transistor RX, the source follower transistor SX, and the selection transistor AX may be formed on another semiconductor chip. The unit pixel region may be formed by arranging the semiconductor chips.

Figure 4:
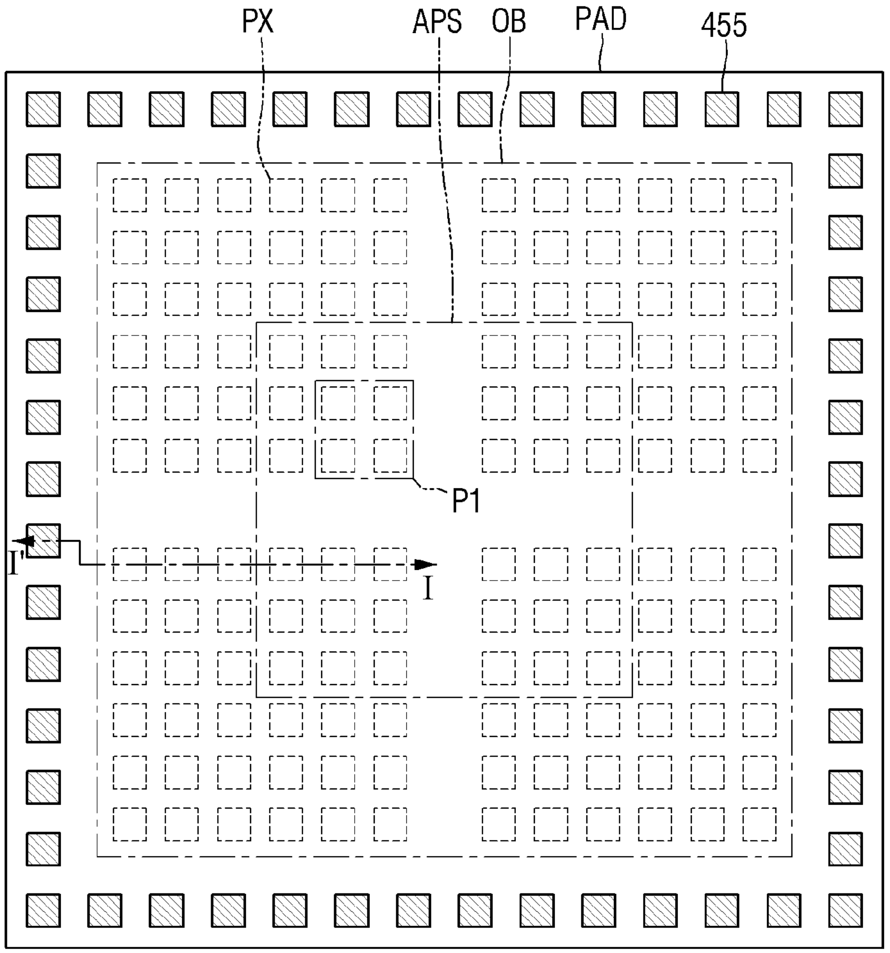
FIG. 4 is an example plan view of an image sensor according to some example embodiments.
Figure 5:
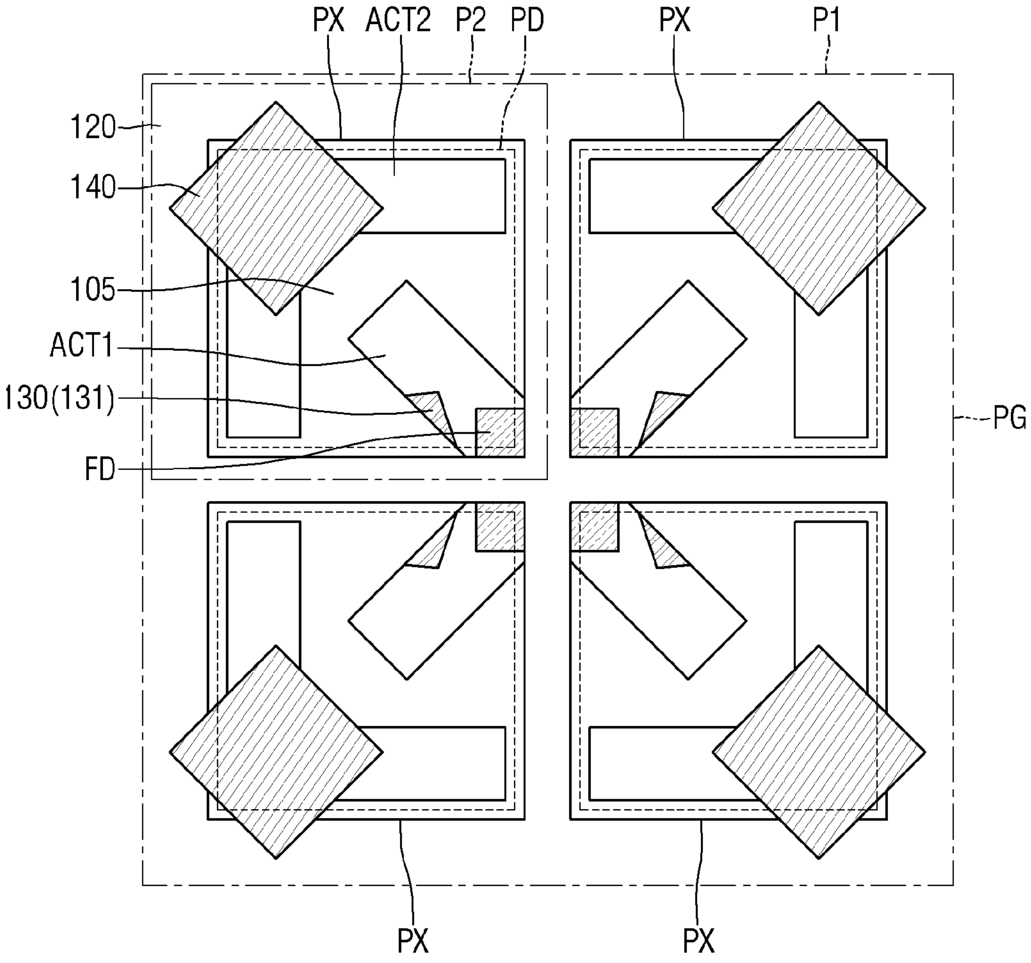
FIG. 5 is an enlarged view of a region P1 of FIG. 4.

FIG. 4 is an example plan view of an image sensor according to some example embodiments. FIG. 5 is an enlarged view of a region P1 of FIG. 4. FIG. 5 may also be a conceptual view to help understanding of some example embodiments, and therefore, not all elements shown in FIG. 5 may be shown when viewed from an observation direction (e.g., from the top).

First, referring to FIG. 4, the image sensor according to some embodiments may include a light-receiving region APS, a light-shielding region OB, and a pad region PAD. A plurality of unit pixel regions PX arranged two-dimensionally (for example, in a form of a matrix) may be formed in the light-receiving region APS and the light-shielding region OB. The unit pixel regions PX may be arranged in the form of a matrix in a plane extending in an x-direction and a y-direction. The x-direction and the y-direction may be directions parallel to a first surface (e.g., 110*a* of FIG. 7) of a first substrate (e.g., 110 of FIG. 7).

Active pixels that are supplied with light to generate an active signal may be provided in the light-receiving region APS. Optical black pixels that generate optical black signals by blocking the light may be provided in the light-shielding region OB. The light-shielding region OB may be formed, for example, along a periphery of the light-receiving region APS, but this is merely an example. In some embodiments, a dummy unit pixel region (e.g., DPX of FIG. 9) may be formed in the light-shielding region OB. The dummy unit pixel region DPX may be a pixel that does not generate an active signal.

The pad region PAD may be formed around the light-shielding region OB. The pad region PAD may be formed to be adjacent to an edge of the image sensor according to some embodiments, but this is only an example. The pad region PAD may be connected to an external device or the like and configured to transmit and receive electrical signals to and from the image sensor according to some embodiments and the external device. For example, a second pad structure 455 may be provided on the pad region PAD. The second pad structure 455 may be connected to an external device or the like. This will be explained below in more detail using FIG. 9.

Referring to FIGS. 4 and 5, the image sensor according to some embodiments may include a plurality of pixel groups PG. The pixel group PG may include, for example, a plurality of unit pixel regions PX adjacent to each other. For example, one pixel group PG may include four unit pixel regions PX as shown in FIG. 5, but example embodiments are not limited thereto. Each unit pixel region PX may include one photoelectric conversion layer PD.

The four unit pixel regions PX may be arranged in two rows and two columns. For example, two unit pixel regions PX may be adjacent to each other in the x-direction and two unit pixel regions PX may be adjacent to each other in the y-direction. Each unit pixel region PX may be defined by a pixel separation pattern 120. The pixel separation pattern 120 may surround the unit pixel region PX.

Each unit pixel region PX may include a floating diffusion region FD. In some embodiments, the floating diffusion region FD may be provided at a central portion of the pixel group PG. In some embodiments, the floating diffusion region FD may be provided at a corner of each unit pixel region PX. The unit pixel regions PX within the pixel group PG may be symmetrical to each other based on a center of the pixel group PG. For example, a unit pixel region PX provided at a left upper end of the pixel group PG may be y-axis symmetrical with a unit pixel region PX provided at a right upper end of the pixel group PG. A unit pixel region PX provided at a left lower end of the pixel group PG may be y-axis symmetrical with a unit pixel region PX provided at a right lower end of the pixel group PG. The unit pixel region PX provided at the left upper end of the pixel group PG may be origin-symmetrical with the unit pixel region PX provided at the right lower end of the pixel group PG.

The unit pixel region PX will be described below in more detail.

Figure 6:
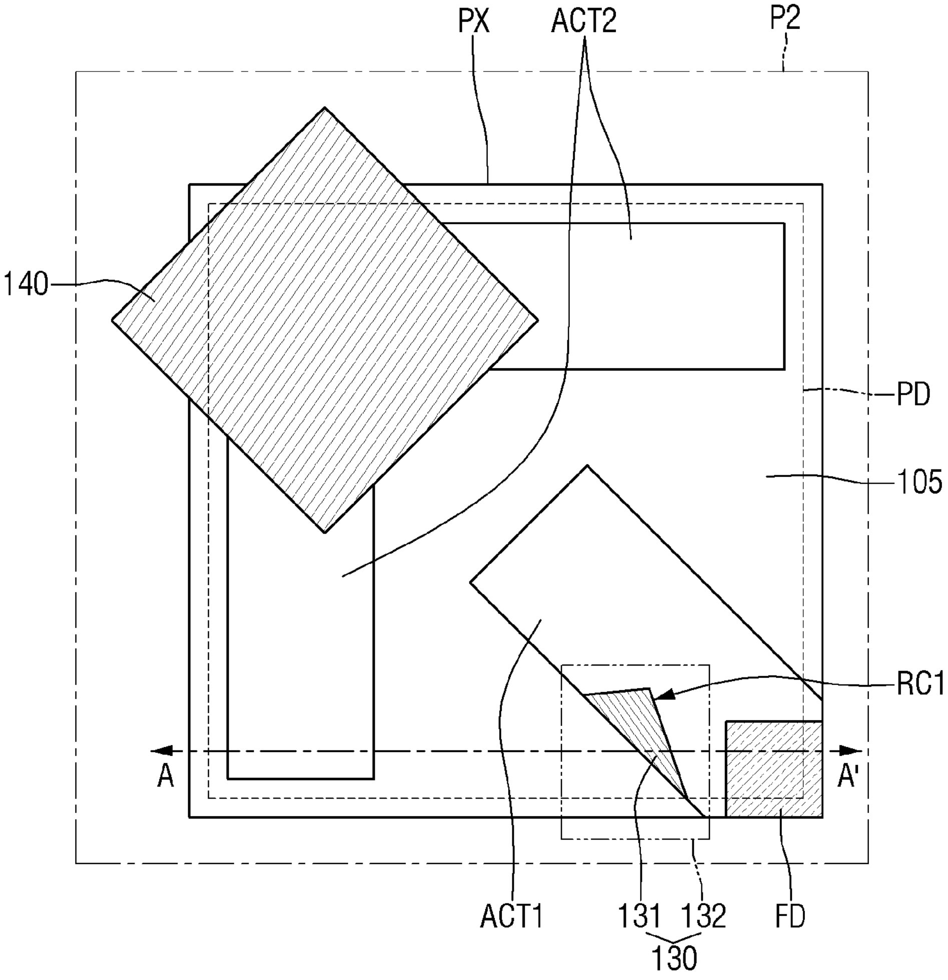
FIG. 6 is an enlarged view of a region P2 of FIG. 5.
Figure 7:
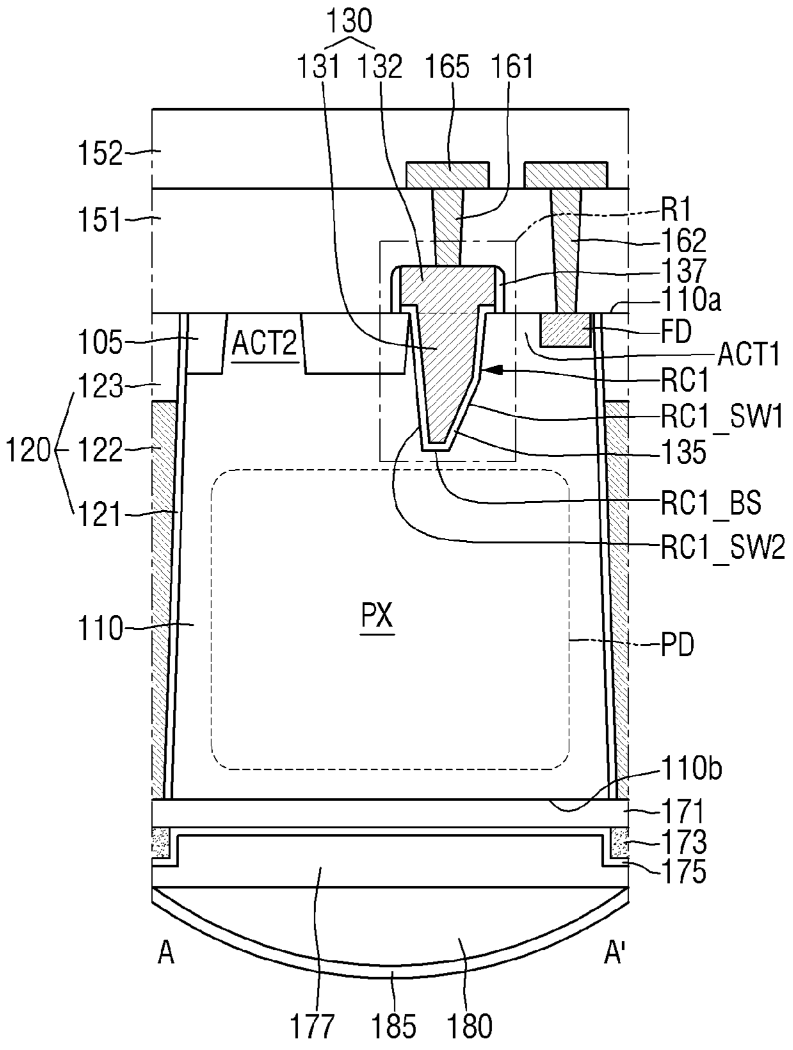
FIG. 7 is an example cross-sectional view taken along line A-A' of FIG. 6.
Figure 8A:
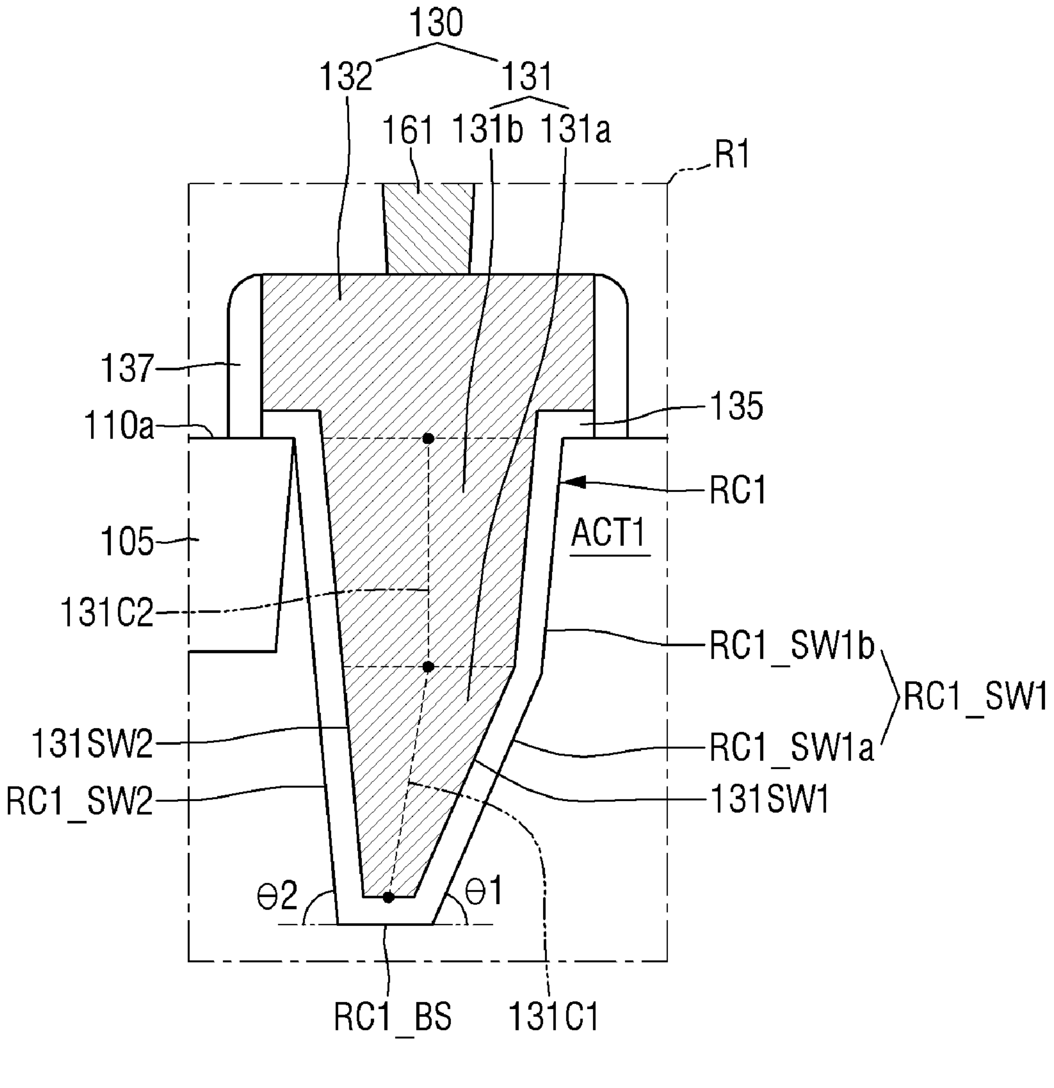
FIGS. 8A and 8B are an enlarged views of a region R1 of FIG. 7.
Figure 8B:
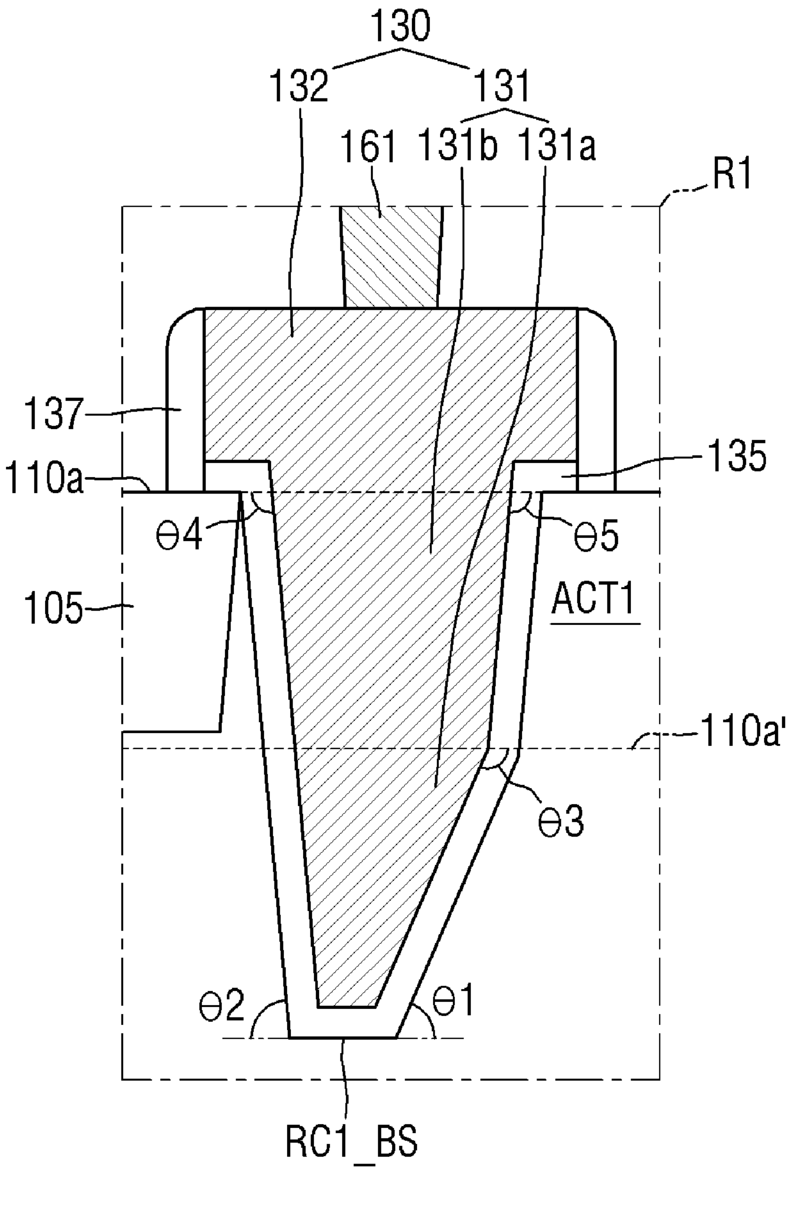

FIG. 6 is an enlarged view of a region P2 of FIG. 5. FIG. 7 is an example cross-sectional view taken along line A-A' of FIG. 6. FIGS. 8A, 8B are an enlarged view of a region R1 of FIG. 7. FIG. 6 may also be a conceptual view to help understanding of some example embodiments, and therefore, not all elements shown in FIG. 6 may be shown when viewed from an observation direction (e.g., from the top).

Referring to FIGS. 6 to 8, the image sensor according to some embodiments may include a first substrate 110, an element separation pattern 105, a pixel separation pattern 120, a transfer gate insulating film 135, a transfer gate electrode 130, a transfer gate spacer 137, and a microlens 180.

The first substrate 110 may be a semiconductor substrate. For example, the first substrate 110 may be bulk silicon or silicon-on-insulator (SOI). The first substrate 110 may be a silicon substrate or may include other materials, for example, silicon germanium, indium antimonide, lead telluride, indium arsenide, indium phosphide, gallium arsenide and/or gallium antimonide. Alternatively, the first substrate 110 may be one in which an epitaxial layer is formed on a base substrate.

The first substrate 110 may include a first surface 110*a* and a second surface 110*b* that are opposite to each other. In some embodiments, the second surface 110*b* of the first substrate 110 may be a light-receiving surface onto which light is incident. That is, the image sensor according to some embodiments may be a backside illuminated (BSI) image sensor.

The first surface 110*a* and the second surface 110*b* may be opposite to each other in the vertical direction. In this specification, the "vertical direction" may be a direction that is perpendicular to the first surface 110*a* and the second surface 110*b*. That is, the "vertical direction" may be a direction from the first surface 110*a* toward the second surface 110*b*, or a direction from the second surface 110*b* toward the first surface 110*a*.

The photoelectric conversion layer PD may be provided in the first substrate 110 of the unit pixel region PX. The photoelectric conversion layer PD may correspond to the photoelectric conversion layer PD of FIG. 3. That is, the photoelectric conversion layer PD may generate charges in proportion to the amount of light incident from the outside. The photoelectric conversion layer PD may be formed by an ion implantation process. For example, the photoelectric conversion layer PD may be a region in which n-type impurities (for example, phosphorus (P) or arsenic (As)) are ion-implanted into the p-type first substrate 110.

A position of the photoelectric conversion layer PD within the first substrate 110, that is, a position of the photoelectric conversion layer PD between the first surface 110*a* and the second surface 110*b* of the first substrate 110, may vary depending on one or more conditions related to the ion implantation process. A doping depth of impurity ions may be set in the ion implantation process. Impurity ions at a high concentration may be initially implanted to a small space of a doping depth that is set in the first substrate 110. The implanted impurity ions may diffuse from an implanted position to a peripheral region of a low concentration of the impurity ions. In the absence of other limiting conditions, the diffusion direction of impurity ions may be in all directions in three dimensions. As the diffusion progresses, a volume of the photoelectric conversion layer PD increases, but the impurity ion concentration per unit volume may decrease. For example, the concentration of impurity ions in the photoelectric conversion layer PD may decrease as the impurity ions move farther away from the initially implanted region, and a maximum impurity concentration region in the photoelectric conversion layer PD may be a region corresponding to the set doping depth. However, the impurity concentration distribution in the photoelectric conversion layer PD after the diffusion is completed may be variously modified, depending on diffusion conditions, differences in the constituent materials for each region of the first substrate 110, presence or absence of other impurities, a geometrical shape of the first substrate 110, or the like, without being limited thereto. Further, the doping depth of impurity ions may be set to be the same for all unit pixel regions PX, or may be set to be different for each unit pixel region PX.

The impurity concentration may have a tendency to be proportional to the potential applied to the photoelectric conversion layer PD. For example, a region with a relatively high impurity concentration may have a relatively high potential, and a region with a relatively low impurity concentration may have a relatively low potential. The higher the potential of the photoelectric conversion layer PD is, the more charges may be generated and/or accumulated. Therefore, the maximum impurity concentration region of the photoelectric conversion layer PD may be a region in which the maximum amount of charges is generated and/or accumulated.

The unit pixel region PX may include a first active region ACT1 and a second active region ACT2. The first active region ACT1 and the second active region ACT2 may be provided on or in the first substrate 110. The first active region ACT1 and the second active region ACT2 may extend from the first surface 110*a* of the first substrate 110 into the first substrate 110. The first active region ACT1 and the second active region ACT2 may be spaced apart from each other. The first active region ACT1 and the second active region ACT2 may be separated by the element separation pattern 105.

The element separation pattern 105 may be provided on or inside the first substrate 110. The element separation pattern 105 may extend from the first surface 110*a* of the first substrate 110 into the first substrate 110. The element separation pattern 105 may extend in the vertical direction from the first surface 110*a* of the first substrate 110 toward the second surface 110*b* of the first substrate 110.

For example, the element separation pattern 105 may be formed by burying an insulating material inside a shallow trench, which is formed by patterning the first substrate 110 including the first surface 110*a*. The element separation pattern 105 may surround the first active region ACT1 and the second active region ACT2. The element separation pattern 105 may define the first active region ACT1 and the second active region ACT2. The element separation pattern 105 may include, for example, at least one of silicon oxide, silicon nitride, silicon oxynitride, and any combination thereof.

The pixel separation pattern 120 may be provided on or inside the first substrate 110. The pixel separation pattern 120 may define a plurality of unit pixel regions PX in the first substrate 110. The pixel separation pattern 120 may extend from the first surface 110*a* of the first substrate 110 into the first substrate 110. In some embodiments, the pixel separation pattern 120 may extend from the first surface 110*a* of the first substrate 110 to the second surface 110*b* of the first substrate 110. That is, the pixel separation pattern 120 may completely penetrate the first substrate 110 in the vertical direction.

The pixel separation pattern 120 may be formed, for example, by burying an insulating material into a deep trench, which is formed by patterning the first substrate 110. For example, the pixel separation pattern 120 may be a front deep trench isolation (FDTI).

From a planar viewpoint, the pixel separation pattern 120 may have a lattice structure. From a planar viewpoint, the pixel separation pattern 120 may completely surround each unit pixel region PX.

The pixel separation pattern 120 may include a liner film 121, a conductive film 122, and a capping film 123. The liner film 121 may be provided along side walls of the trench in which the pixel separation pattern 120 is formed. The conductive film 122 may be provided between the liner films 121. The capping film 123 may be provided on the conductive film 122.

The liner film 121 may include an oxide film having a lower refractive index than the first substrate 110. For example, the liner film 121 may include, but not limited to, at least one of silicon oxide, aluminum oxide, tantalum oxide, and any combination thereof. The liner film 121 having a lower refractive index than the first substrate 110 may refract or reflect light that is obliquely incident onto the photoelectric conversion layer PD. Furthermore, the liner film 121 may be used to prevent photocharges generated in a specific unit pixel region PX by the incident light from moving to an adjacent unit pixel region PX due to a random drift. That is, the liner film 121 may improve a light-receiving rate of the photoelectric conversion layer PD to improve the quality of the image sensor according to some embodiments.

In some embodiments, the conductive film 122 may include a conductive material. For example, the conductive film 122 may include, but not limited to, polysilicon (poly Si). In some embodiments, a negative voltage may be applied to the conductive film 122 that includes a conductive material. An electrostatic discharge (ESD) failure of the image sensor according to some embodiments may be effectively prevented accordingly. Here, the ESD failure refers to a phenomenon in which the charges generated by ESD or the like are accumulated on the surface of the substrate (e.g., the second surface 110*b*), causing bruise-like stains on the generated image.

In some embodiments, the capping film 123 may include an insulating material. For example, the capping film 123 may include a silicon-based insulating material (e.g., silicon nitride, silicon oxide, and/or silicon oxynitride) and a high dielectric material (e.g., hafnium oxide and/or aluminum oxide).

In some embodiments, a transfer transistor (e.g., TX of FIG. 3) may include the transfer gate electrode 130, the transfer gate insulating film 135, and the transfer gate spacer 137.

The transfer gate electrode 130 may be provided on the first surface 110*a* of the first substrate 110. The transfer gate electrode 130 may be provided on the first substrate 110 between the photoelectric conversion layer PD and the floating diffusion region FD. The transfer gate electrode 130 may be provided on the first active region ACT1. The transfer gate electrode 130 may be provided on the photoelectric conversion layer PD. The transfer gate electrode 130 may be a vertical transfer gate. That is, at least a part of the transfer gate electrode 130 may be buried in the first substrate 110.

The transfer gate electrode 130 may be a gate electrode (e.g., TG of FIG. 3) of a transfer transistor (e.g., TX of FIG. 3). For example, when the transfer gate electrode 130 is turned on, the charges generated from the photoelectric conversion layer PD may be transferred to the floating diffusion region FD.

The transfer gate insulating film 135 may be interposed between the transfer gate electrode 130 and the first active region ACT1. A part of the transfer gate insulating film 135 may be provided on the element separation pattern 105.

The transfer gate spacer 137 may be provided on side walls of the transfer gate electrode 130. For example, the transfer gate spacer 137 may be provided on a side wall of a connecting part 132 of the transfer gate electrode 130, which will be described below.

In some embodiments, the transfer gate electrode 130 may include a first extending part 131 and the connecting part 132.

The first extending part 131 may be provided on or inside the first substrate 110. The first extending part 131 may be provided in a first recess RC1. The first recess RC1 may be provided in the first active region ACT1. The first recess RC1 may extend in the vertical direction from the first surface 110*a* of the first substrate 110. The first recess RC1 may be formed by etching the first substrate 110 formed of silicon. The first extending part 131 may fill at least a part of the first recess RC1. For example, the first extending part 131 may be provided on the transfer gate insulating film 135, which will be described below.

The connecting part 132 may be provided on the first extending part 131. The connecting part 132 may be provided on the first surface 110*a* of the first substrate 110. The connecting part 132 may be connected to the first extending part 131. The connecting part 132 may be connected to a first contact 161, which will be described below.

In FIG. 8A, the first recess RC1 may include a bottom surface RC1_BS, a first side wall RC1_SW1, and a second side wall RC1_SW2.

The first side wall RC1_SW1 of the first recess RC1 may face the floating diffusion region FD. The second side wall RC1_SW2 of the first recess RC1 may be opposite to the floating diffusion region FD. The second side wall RC1_SW2 of the first recess RC1 may be opposite to the first side wall RC1_SW1.

The bottom surface RC1_BS of the first recess RC1 may connect the first side wall RC1_SW1 and the second side wall RC1_SW2. While the bottom surface RC1_BS of the first recess RC1 is shown as being flat in FIG. 8A, the shape of the bottom surface RC1_BS is not limited thereto.

In some embodiments, an angle between the bottom surface RC1_BS of the first recess RC1 and the first side wall RC1_SW1 may be a first angle θ1. Specifically, the first angle θ1 may be an angle between an extension line of the bottom surface RC1_BS of the first recess RC1 and the first side wall RC1_SW1.

An angle between the bottom surface RC1_BS of the first recess RC1 and the second side wall RC1_SW2 may be a second angle θ2. Specifically, the second angle θ2 may be an angle between an extension line of the bottom surface RC1_BS of the first recess RC1 and the second side wall RC1_SW2.

The first angle θ1 may be smaller than the second angle θ2. That is, the slope of the first side wall RC1_SW1 connected to the bottom surface RC1_BS of the first recess RC1 may be smaller than the slope of the second side wall RC1_SW2. Accordingly, the distance from the photoelectric conversion layer PD to the floating diffusion region FD may decrease, compared to a case in which such a configuration is not provided. Accordingly, the transfer efficiency of the transfer transistor TX may be improved.

In some embodiments, the first side wall RC1_SW1 may include a first portion RC1_SWla and a second portion RC1_SW1*b*.

The second portion RC1_SW1*b* may be provided on the first portion RC1_SWla. The first portion RC1_SWla may be provided on or below the second portion RC1_SW1*b*. The first portion RC1_SWla and the second portion RC1_SW1*b* may be directly connected to each other. The first portion RC1_SWla may be connected to the bottom surface RC1_BS of the first recess RC1. The second portion RC1_SW1*b* may be connected to the first surface 110*a* of the first substrate 110.

In some embodiments, the slope of the first portion RC1_SWla may be smaller than the slope of the second portion RC1_SW1*b*. That is, the slope of the first side wall RC1_SW1 of the first recess RC1 may be changed at a boundary between the first portion RC1_SWla and the second portion RC1_SW1*b*. While the first portion RC1_SWla and the second portion RC1_SW1*b* are shown as being connected to each other, the inventive concept of the present disclosure is not limited thereto.

In FIG. 8B, the region R1 may include a third angle θ3, a fourth angle θ4, and a fifth angle θ5.

The first extending part 131 of the transfer gate electrode include a third surface and a fourth surface facing the third surface. The fourth surface, the third surface, and the floating diffusion region are sequentially arranged in a first direction parallel to the first surface of the substrate.

In some embodiments, the first extending part has a first width in the first direction on the first surface of the substrate and has a second width in the first direction at a bottom of the first extending part. The first width is greater than the second width, and the bottom of the first extending part is a closest part among the first extending part from the second surface of the substrate.

In some embodiments, the third surface has a third angle with respect to an extension line of the first surface 110*a* of the substrate 110 and the fourth surface has a fourth angle θ4 with respect to the extension line of the first surface 110*a* of the substrate 110. And the third angle is greater than the fourth angle θ4.

In some embodiments, the first extending part has a first width at a bottom of the first extending part in the first direction, a second width at a middle of the first extending part in the first direction, and a third width at a top of the first extending part in the first direction. The bottom of the first extending part is a closest part among the first extending part from the second surface of the substrate in a third direction perpendicular to the first direction, the top of the first extending part is connected to the first surface of the substrate, and the middle of the first extending part is between the bottom of the first extending part and the top of the first extending part in the third direction. The second width is greater than the first width, and the third width is greater than the second width.

In some embodiments, the extending part may further include a fifth surface, which has a fifth angle θ5 with respect to the extension line of the first surface 110*a* of the substrate. And the third surface which is spaced apart from the first surface of the substrate has the third angle θ3 with respect to a parallel line 110*a*' of the first surface 110*a* of the substrate 110 and the fourth surface has the fourth angle θ4 with respect to the extension line of the first surface 110*a* of the substrate 110. The fifth angle θ5 is smaller than the third angle θ3.

In some embodiments, the first extending part 131 may include a central axis. The central axis of the first extending part 131 may be an imaginary line that is obtained by determining, for each vertical level, an imaginary point having the same distance to side walls of the first extending part 131 among points on the same vertical level, and connecting the determined imaginary points. In this specification, the same vertical level may mean that the distance in the vertical direction from the first surface 110*a* of the first substrate 110 is constant.

In some embodiments, at least a part of the central axis of the first extending part 131 may not extend in the vertical direction. At least a part of the central axis of the first extending part 131 may be inclined toward the floating diffusion region FD. Since at least a part of the central axis of the first extending part 131 is inclined toward the floating diffusion region FD, a movement distance of the charges from the photoelectric conversion layer PD to the floating diffusion region FD may be shortened.

For example, the central axis of the first extending part 131 may include a lower part 131C1 and an upper part 131C2. The lower part 131C1 of the central axis of the first extending part 131 may be a central axis of a first sub-portion 131a of the first extending part 131, which will be described below. The upper part 131C2 of the central axis of the first extending part 131 may be a central axis of a second sub-portion 131b of the first extending part 131, which will be described below.

The lower part 131C1 of the central axis of the first extending part 131 may not extend in the vertical direction. The lower part 131C1 of the central axis of the first extending part 131 may be inclined toward the floating diffusion region FD. On the other hand, the upper part 131C2 of the central axis of the first extending part 131 may extend in the vertical direction. The upper part 131C2 of the central axis of the first extending part 131 may not be inclined toward the floating diffusion region FD. The slope of the lower part 131C1 of the central axis of the first extending part 131 may be different from the slope of the upper part 131C2 of the central axis of the first extending part 131.

In some embodiments, the first extending part 131 may include the first sub-portion 131a and the second sub-portion 131b.

The second sub-portion 131b may be provided on the first sub-portion 131a. The central axis of the first sub-portion 131a may be the lower part 131C1 of the central axis of the first extending part 131, and the central axis of the second sub-portion 131b may be the upper part 131C2 of the central axis of the first extending part 131. The slope of the central axis of the first sub-portion 131a may be different from the slope of the central axis of the second sub-portion 131b. Further, the width of the first sub-portion 131a may be the same as the width of the second sub-portion 131b at a boundary between the first sub-portion 131a and the second sub-portion 131b.

In some embodiments, the first extending part 131 may include a side wall 131SW1 facing the floating diffusion region FD, and a side wall 131SW2 opposite to the floating diffusion region FD. The slope of the side wall 131SW1 of the first extending part 131 facing the floating diffusion region FD may be smaller than the slope of the side wall 131SW2 of the first extending part 131 opposite to the floating diffusion region FD.

The charges generated in the photoelectric conversion layer PD are transferred to the floating diffusion region FD through the transfer transistor TX. The larger the distance between the photoelectric conversion layer PD and the floating diffusion region FD is, the lower the transfer efficiency of the transfer transistor TX may be. In the image sensor according to some embodiments, since at least a part of the first extending part 131 of the transfer gate electrode 130 is inclined toward the floating diffusion region FD, the transfer efficiency of the transfer transistor TX may be improved or enhanced.

The transfer gate electrode 130 may include, for example, but not limited to, at least one of impurity-doped polysilicon (poly Si), metal silicide such as cobalt silicide, metal nitride such as titanium nitride, and metal such as tungsten, copper and aluminum.

The transfer gate insulating film 135 may include, for example, at least one of silicon oxide, silicon oxynitride, silicon nitride, or a high dielectric constant material having a higher dielectric constant than silicon oxide.

The transfer gate spacer 137 may include, for example, but not limited to, at least one of silicon oxide, silicon nitride, silicon oxynitride, and any combination thereof.

A gate electrode 140 may be provided on the first surface 110a of the first substrate 110. The gate electrode 140 may be provided on the second active region ACT2. The gate electrode 140 may be a planar gate. For example, a lower surface of the gate electrode 140 may extend along the first surface 110a of the first substrate 110.

The gate electrode 140 may correspond to one of a gate electrode (for example, RG of FIG. 3) of the reset transistor (for example, RX of FIG. 3), a gate electrode (for example, SF of FIG. 3) of the source follower transistor (for example, SX of FIG. 3), and a gate electrode (e.g., SEL of FIG. 3) of the selection transistor (e.g., AX of FIG. 3).

While only one gate electrode 140 is shown as being provided in one unit pixel region PX, this is only an example, and a plurality of operating gate electrodes having different functions may also be provided in one unit pixel region PX. For example, at least two gate electrodes among a gate electrode (for example, RG of FIG. 3) of the reset transistor (for example, RX of FIG. 3), a gate electrode (for example, SF of FIG. 3) of the source follower transistor (for example, SX of FIG. 3), and a gate electrode (e.g., SEL of FIG. 3) of the selection transistor (e.g., SX of FIG. 3) may be provided in one unit pixel region PX.

Referring to FIG. 7 again, the image sensor according to some embodiments may further include first wiring insulating films 151 and 152, a first contact 161, a second contact 162, first wiring patterns 165, a surface insulating film 171, a grid pattern 173, a first protective film 175, a first color filter 177, and a second protective film 185.

The first wiring insulating films 151 and 152 may be formed on the first surface 110a of the first substrate 110. For example, the first wiring insulating films 151 and 152 may cover the first surface 110a of the first substrate 110.

The first wiring insulating films 151 and 152 may include, for example, but not limited to, at least one of silicon oxide, silicon nitride, silicon oxynitride, and a low-k material having a dielectric constant lower than a dielectric constant of silicon oxide.

The first contact 161, the second contact 162, and the first wiring patterns 165 may be provided in the first wiring insulating films 151 and 152. The first contact 161 may be interposed between the first wiring pattern 165 and the transfer gate electrode 130. The first contact 161 may electrically connect the first wiring pattern 165 and the transfer gate electrode 130. The second contact 162 may be interposed between the first wiring patterns 165 and the floating diffusion region FD. The second contact 162 may electrically connect the first wiring patterns 165 and the floating diffusion region FD.

The first and second contacts 161 and 162 and the first wiring pattern 165 may include, for example, but not limited to, at least one of tungsten (W), copper (Cu), aluminum (Al), gold (Au), silver (Ag) or an alloy thereof.

The surface insulating film 171 may be provided on the second surface 110b of the first substrate 110. The surface insulating film 171 may extend along the second surface 110b of the first substrate 110. In some embodiments, at least a part of the surface insulating film 171 may be in contact with the pixel separation pattern 120.

The surface insulating film 171 may include an insulating material. For example, the surface insulating film 171 may include, but not limited to, at least one of silicon oxide, silicon nitride, silicon oxynitride, aluminum oxide, hafnium oxide, and any combination thereof.

The surface insulating film 171 may function as an antireflection film and prevent reflection of light incident on the first substrate 110, thereby improving the light-receiving rate of the photoelectric conversion layer PD. Further, the surface insulating film 171 may function as a flattening film to form the first color filter 177 and the microlens 180, which will be described below, to have a uniform height.

The first color filter 177 may be provided on the surface insulating film 171 of the light-receiving region APS. In some embodiments, the first color filter 177 may be arranged to correspond to each unit pixel region PX. For example, the plurality of first color filters 177 may be arranged two-dimensionally (e.g., in the form of a matrix).

The first color filter 177 may have various color filters depending on the unit pixel region PX. For example, the first color filters 177 may be arranged in a Bayer pattern including a red color filter, a green color filter, and a blue color filter. However, this is only an example, and the first color filter 177 may include a yellow filter, a magenta filter, and a cyan filter, and may further include a white filter.

The grid pattern 173 may be provided on the surface insulating film 171. The grid pattern 173 may have a shape of a lattice from a planar viewpoint, and may be interposed between the plurality of first color filters 177.

The grid pattern 173 may include a low refractive index material having a lower refractive index than silicon (Si). For example, the grid pattern 173 may include, but not limited to, at least one of silicon oxide, aluminum oxide, tantalum oxide, and any combination thereof. The grid pattern 173 including a low refractive index material may improve the quality of the image sensor, by refracting or reflecting light obliquely incident on the image sensor.

In some embodiments, the first protective film 175 may be provided on the surface insulating film 171 and the grid pattern 173. The first protective film 175 may be interposed between the surface insulating film 171 and the first color filter 177, and between the grid pattern 173 and the first color filter 177. For example, the first protective film 175 may extend along the profile of the upper surface of the surface insulating film 171, and the side surfaces and the upper surface of the grid pattern 173.

The first protective film 175 may include, for example, but not limited to, aluminum oxide. The first protective film 175 may prevent damage of the surface insulating film 171 and the grid pattern 173.

The microlens 180 may be provided on the first color filter 177. The microlens 180 may be arranged to correspond to each unit pixel region PX. For example, the microlenses 180 may be arranged two-dimensionally (e.g., in the form of a matrix) on a plane.

The microlens 180 has a convex shape, and may have a predetermined radius of curvature. Accordingly, the microlens 180 may condense the light which is incident on the photoelectric conversion layer PD. The microlens 180 may include, for example, but not limited to, light transmissive resin.

In some embodiments, the second protective film 185 may be provided on the microlens 180. The second protective film 185 may extend along the surface of the microlens 180. The second protective film 185 may include, for example, an inorganic oxide film. For example, the second protective film 185 may include, but not limited to, at least one of silicon oxide, titanium oxide, zirconium oxide, hafnium oxide, and any combination thereof. In some embodiments, the second protective film 185 may include a low temperature oxide (LTO).

The second protective film 185 may protect the microlens 180 from the outside. For example, the second protective film 185 may protect the microlens 180 including an organic substance, by including an inorganic oxide film. Further, the second protective film 185 may improve the light-condensing capability of the microlens 180. For example, the second protective film 185 may reduce reflection, refraction, scattering, or the like of incident light that reaches the space between the microlenses 180, by filling the space between the microlenses 180.

Figure 9:
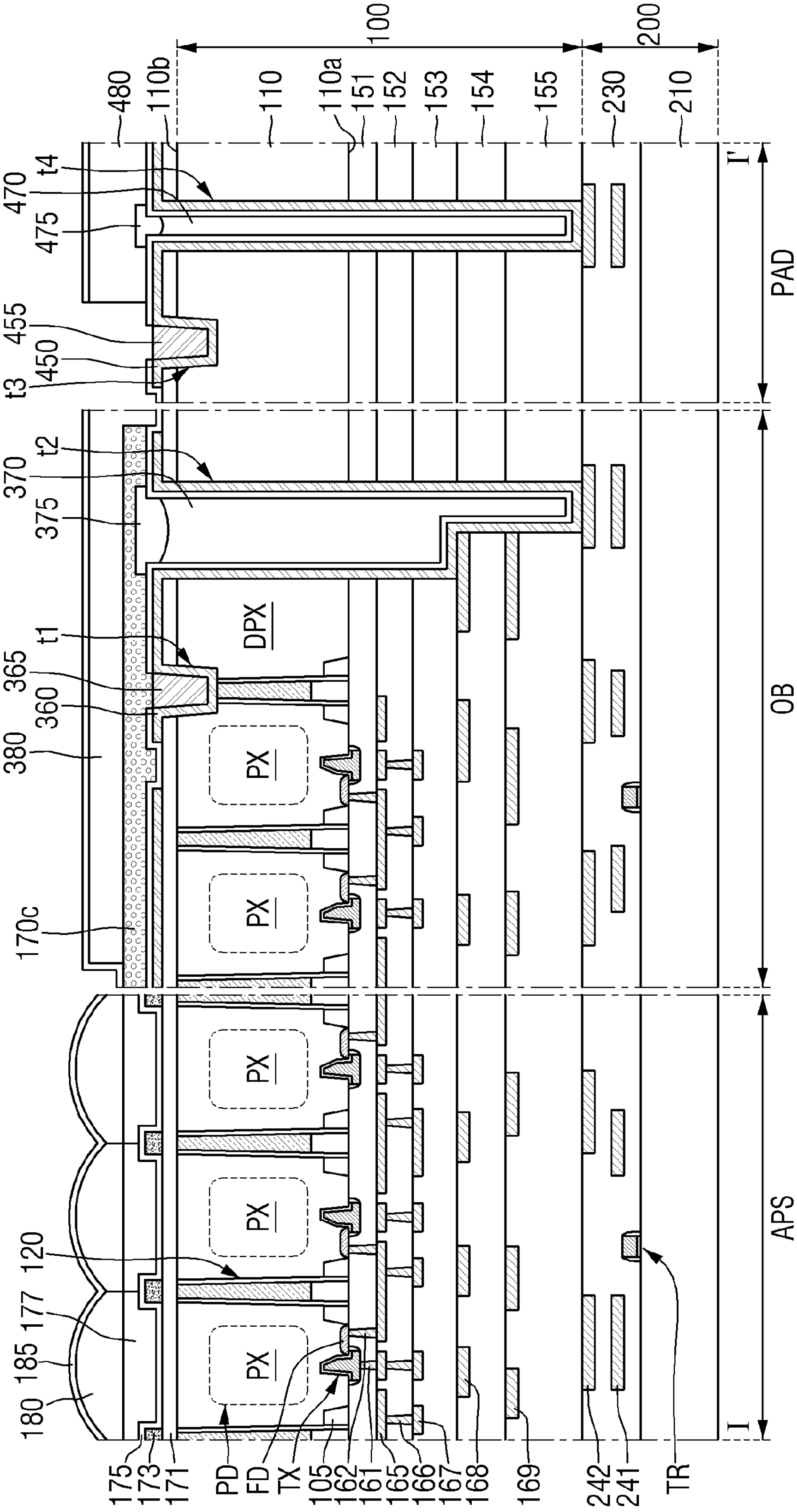
FIG. 9 is an example cross-sectional view taken along line I-I' of FIG. 4.

An image sensor according to some embodiments will be described below in more detail using FIG. 9. For convenience of explanation, repeated contents explained using FIGS. 5 to 8 will be omitted. FIG. 9 is an example cross-sectional view taken along line I-I' of FIG. 4.

Referring to FIG. 9, the image sensor according to some embodiments may include a first semiconductor chip 100 and a second semiconductor chip 200. The first semiconductor chip 100 may be a sensor chip, and the second semiconductor chip 200 may be a logic chip.

The first semiconductor chip 100 may include a light-receiving region APS, a light-shielding region OB, and a pad region PAD. A plurality of unit pixel regions PX arranged two-dimensionally (for example, in the form of a matrix) may be formed in the light-receiving region APS and the light-shielding region OB.

The semiconductor device according to some embodiments may further include a first connecting structure 360 and a second connecting structure 450.

The first connecting structure 360 may be provided in the light-shielding region OB. The first connecting structure 360 may block light that is incident onto the light-shielding region OB. The first connecting structure 360 may be formed on the surface insulating film 171 of the light-shielding region OB. The first connecting structure 360 may come into contact with the pixel separation pattern 120. The first connecting structure 360 may be connected to the conductive film 122 of the pixel separation pattern 120.

For example, a first trench t1 which exposes the conductive film 122 may be formed inside the first substrate 110 and the surface insulating film 171 of the light-shielding region OB. The first connecting structure 360 may be formed in the first trench t1, and may come into contact with the conductive film 122 in the light-shielding region OB. The first connecting structure 360 may extend along the profile of the side walls and bottom surface of the first trench t1.

For example, the first connecting structure 360 may be electrically connected with the conductive film 122. The first connecting structure 360 may include, for example, a titanium (Ti) film, a titanium nitride (TiN) film, and a tungsten (W) film, which are sequentially stacked.

In some embodiments, a first pad structure 365 may be provided on the first connecting structure 360. The first pad structure 365 may fill the first trench t1 that remains after the first connecting structure 360 fills the first trench t1. A voltage may be applied to the conductive film 122 of the pixel separation pattern 120 through the first pad structure 365. Accordingly, the charges generated by ESD or the like may be discharged to the first pad structure 365 through the conductive film 122, and an ESD bruise failure may be effectively prevented.

The first pad structure 365 may include, for example, but not limited to, at least one of tungsten (W), copper (Cu), aluminum (Al), gold (Au), silver (Ag), and alloys thereof.

In some embodiments, a second trench t2 may be formed in the first substrate 110 of the light-shielding region OB. The second trench t2 may expose a part of a first wiring pattern 168 of the first semiconductor chip 100. The first connecting structure 360 may be formed in the second trench t2, and may be connected to the first wiring pattern 168. The first connecting structure 360 may extend along side walls and a bottom surface of the first trench t2.

In some embodiments, a first filling insulating film 370 may be formed on the first connecting structure 360. The first filling insulating film 370 may fill the second trench t2 that remains after the first connecting structure 360 fills the second trench t2. The first filling insulating film 370 may include, for example, but not limited to, at least one of silicon oxide, aluminum oxide, tantalum oxide, and any combination thereof.

In some embodiments, a first capping pattern 375 may be formed on the first filling insulating film 370. The first capping pattern 375 may include a silicon-based insulating material (e.g., silicon nitride, silicon oxide, and/or silicon oxynitride) and a high dielectric constant material (e.g., hafnium oxide and/or aluminum oxide). The first capping pattern 375 may include the same material as the capping film 123. However, the inventive concept of the present disclosure is not limited thereto.

In some embodiments, a second color filter 170*c* may be formed on the first connecting structure 360. For example, the second color filter 170*c* may be formed to partially cover the first protective film 175 in the light-shielding region OB. The second color filter 170*c* may include, for example, but not limited to, a blue color filter.

In some embodiments, a third protective film 380 may be formed on the second color filter 170*c*. For example, the third protective film 380 may be formed to partially cover the first protective film 175 in the light-shielding region OB. In some embodiments, the second protective film 185 may extend along the surface of the third protective film 380. The third protective film 380 may include, for example, but not limited to, light transmissive resin. In some embodiments, the third protective film 380 may include the same material as the microlens 180.

The second connecting structure 450 may be formed in the pad region PAD. The second connecting structure 450 may be formed on the surface insulating film 171 of the pad region PAD.

In some embodiments, a third trench t3 may be formed in the first substrate 110 of the pad region PAD. The second connecting structure 450 may partially fill the third trench t3. The second connecting structure 450 may be formed along side walls and a bottom surface of the third trench t3.

A fourth trench t4 may be formed inside the first semiconductor chip 100 of the pad region PAD. The fourth trench t4 may be connected to a second wiring pattern 242 of the second semiconductor chip 200. The second connecting structure 450 may partially fill the fourth trench t4. The second connecting structure 450 may be formed along a side wall and a bottom surface of the fourth trench t4.

The second connecting structure 450 is formed in the fourth trench t4, and may be in contact with a part of the second wiring pattern 242. The second connecting structure 450 may electrically connect a part of the second wiring pattern 242 and the second pad structure 455. The second connecting structure 450 may include, for example, a titanium (Ti) film, a titanium nitride (TiN) film, and a tungsten (W) film that are sequentially stacked.

The second pad structure 455 may be formed on the second connecting structure 450. The second pad structure 455 may fill the third trench t3 that remains after the second connecting structure 450 fills the third trench t3. The second pad structure 455 may include, for example, but not limited to, at least one of tungsten (W), copper (Cu), aluminum (Al), gold (Au), silver (Ag), and alloys thereof.

In some embodiments, a part of the second pad structure 455 may be exposed. For example, an exposure opening that exposes the second pad structure 455 may be formed. Accordingly, the second pad structure 455 may be connected to an external device or the like, and configured to transmit and receive electrical signals between the semiconductor device according to some embodiments and the external device.

A second filling insulating film 470 may be formed on the second connecting structure 450. The second filling insulating film 470 may fill the fourth trench t4 that remains after the second connecting structure 450 fills the fourth trench t4. The second filling insulating film 470 may include, for example, but not limited to, at least one of silicon oxide, aluminum oxide, tantalum oxide, and any combination thereof.

In some embodiments, a second capping pattern 475 may be formed on the second filling insulating film 470. The second capping pattern 475 may include a silicon-based insulating material (e.g., silicon nitride, silicon oxide, and/or silicon oxynitride) and a high dielectric material (e.g., hafnium oxide and/or aluminum oxide). The second capping pattern 475 may include the same material as the capping film 121C. However, the inventive concept of the present disclosure is not limited thereto.

In some embodiments, a fourth protective film 480 may be formed on the second connecting structure 450 of the pad region PAD. For example, the fourth protective film 480 may be formed to partially cover the first protective film 175 in the pad region PAD. In some embodiments, the second protective film 185 may extend along the surface of the fourth protective film 480. The fourth protective film 480 may include, for example, but not limited to, light transmissive resin. In some embodiments, the fourth protective film 480 may include the same material as the microlens 180.

In some embodiments, the first semiconductor chip 100 may further include first wiring insulating films 153 and 154, first wiring patterns 167, 168, and 169, and wiring contacts 166.

The first wiring insulating films 153 and 154 may be stacked on first wiring insulating films 151 and 152. The first wiring insulating films 153 and 154 may include, for example, but not limited to, at least one of silicon oxide, silicon nitride, silicon oxynitride, and a low-k material having a dielectric constant lower than a dielectric constant of silicon oxide.

The first wiring patterns 167, 168 and 169 and the wiring contacts 166 may be provided inside the first wiring insulating films 152, 153 and 154. The wiring contacts 166 may electrically connect the first wiring patterns 167, 168, and 169 having different levels from each other. The first wiring patterns 167, 168 and 169 and the wiring contacts 166 may include, for example, but not limited to, at least one of tungsten (W), copper (Cu), aluminum (Al), gold (Au), silver (Ag), and an alloy thereof.

In some embodiments, the second semiconductor chip 200 may include a second substrate 210, a second wiring insulating film 230, a plurality of transistors TR, and a plurality of second wiring patterns 241 and 242.

The second substrate 210 may be bulk silicon or silicon-on-insulator (SOI). The second substrate 210 may be a silicon substrate, or may include other materials, for example, silicon germanium, indium antimonide, lead telluride, indium arsenide, indium phosphide, gallium arsenide or gallium antimonide. Alternatively, the second substrate 210 may be one in which an epitaxial layer is formed on a base substrate.

The second substrate 210 may include an upper surface and a lower surface. The upper surface of the second substrate 210 may be a surface that faces the first semiconductor chip 100. The lower surface of the second substrate 210 may be a surface that is opposite to the upper surface of the second substrate 210.

A plurality of transistors TR may be formed on the upper surface of the second substrate 210. The transistors TR may be, for example, a logic circuit. The transistors TR may control the transfer transistor TX, the reset transistor (e.g., RX of FIG. 3), the selection transistor (e.g., AX of FIG. 3), and the source follower transistor (e.g., SX of FIG. 3).

The second wiring insulating film 230 may be formed on the second substrate 210. For example, the second wiring insulating film 230 may cover the upper surface of the second substrate 210. The second substrate 210 and the second wiring insulating film 230 may provide the second semiconductor chip 200. The second wiring insulating film 230 may include, for example, but not limited to, at least one of silicon oxide, silicon nitride, silicon oxynitride, and a low dielectric constant (low-k) material having a dielectric constant lower than a dielectric constant of silicon oxide.

The plurality of second wiring patterns 241 and 242 may be provided inside the second wiring insulating film 230. The plurality of second wiring patterns 241 and 242 may each be connected to the transistors TR, and may be connected to the floating diffusion region FD of the first semiconductor chip 100. A part of the plurality of second wiring patterns 241 and 242 may be connected to the first connecting structure 360. Further, another part of the plurality of second wiring patterns 241 and 242 may be connected to the second connecting structure 450. However, the inventive concept of the present disclosure is not limited thereto.

Each of the second wiring patterns 241 and 242 may include, for example, but not limited to, at least one of tungsten (W), copper (Cu), aluminum (Al), gold (Au), silver (Ag), and an alloy thereof.

An image sensor according to some other example embodiments will be described below with reference to FIGS. 10 to 26.

Figure 10:
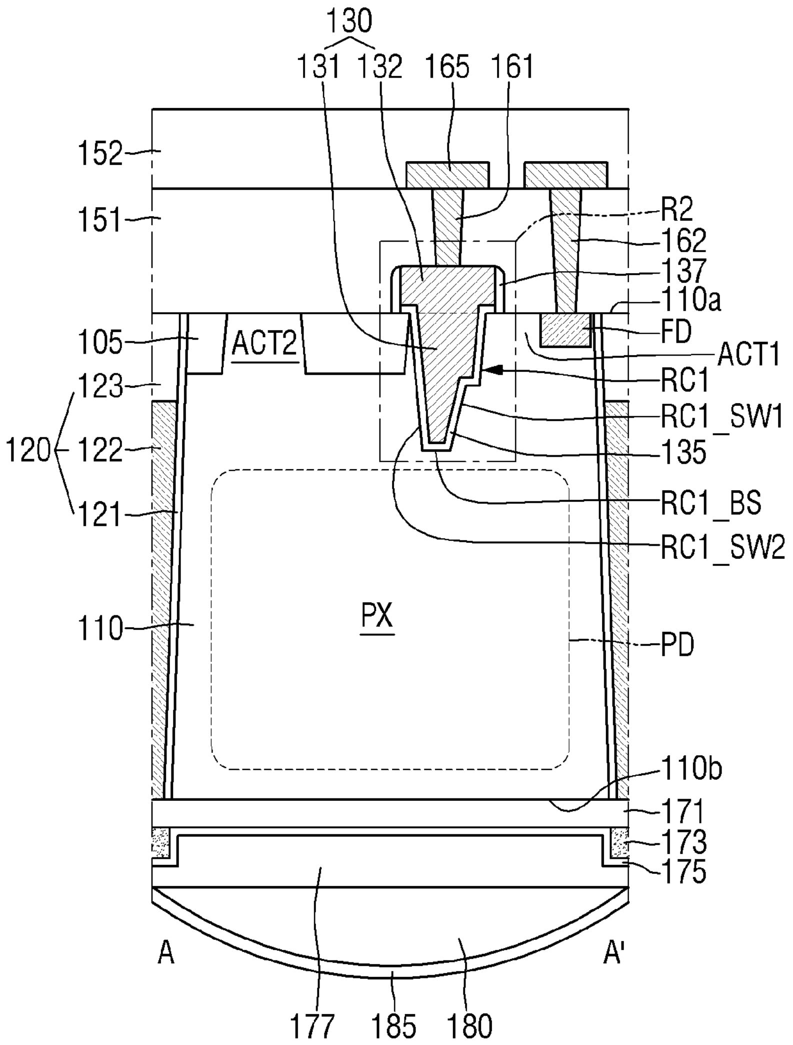
FIGS. 10 to 12 are diagrams of the image sensor according to some example embodiments.
Figure 11A:
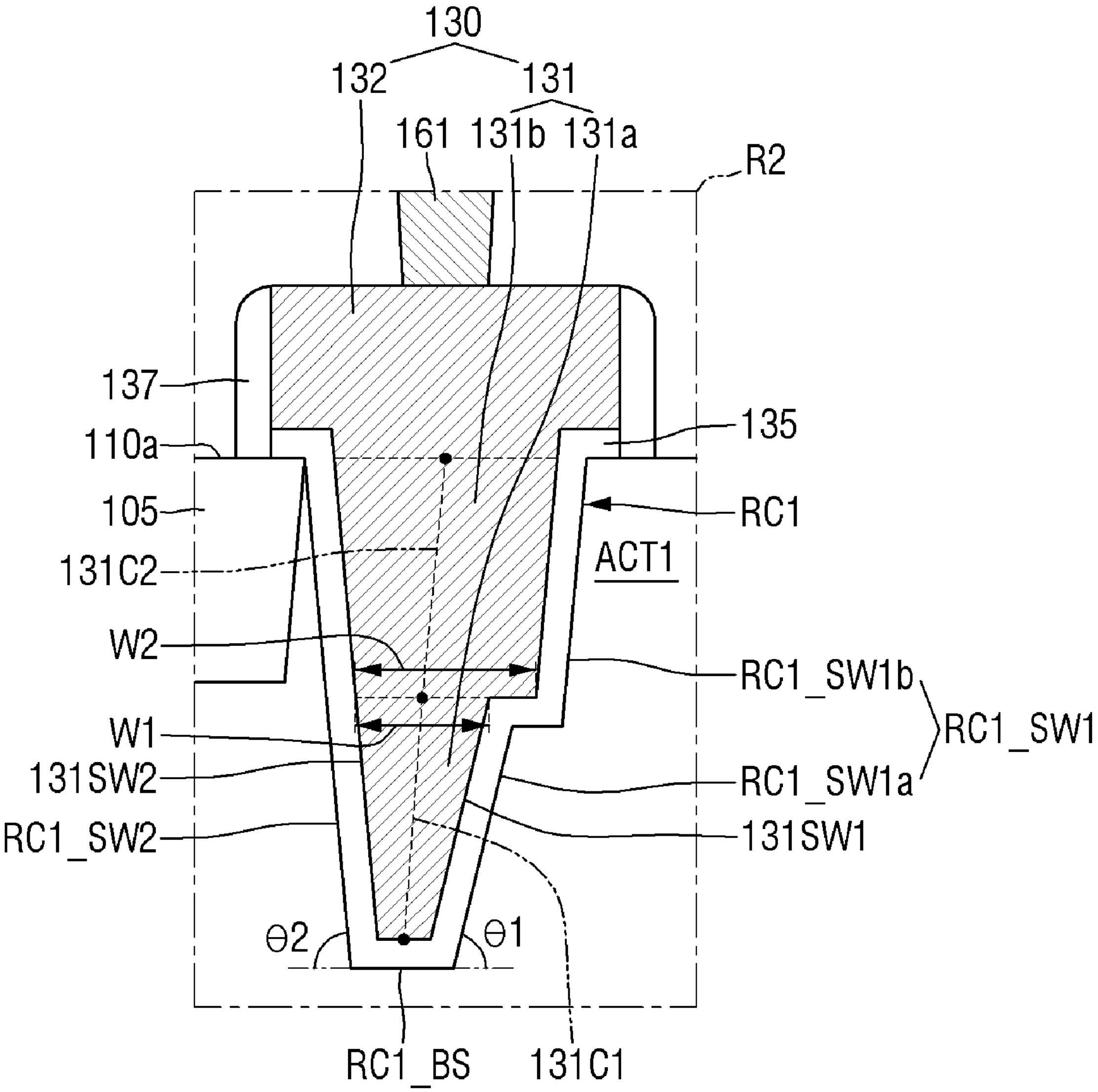
Figure 11B:
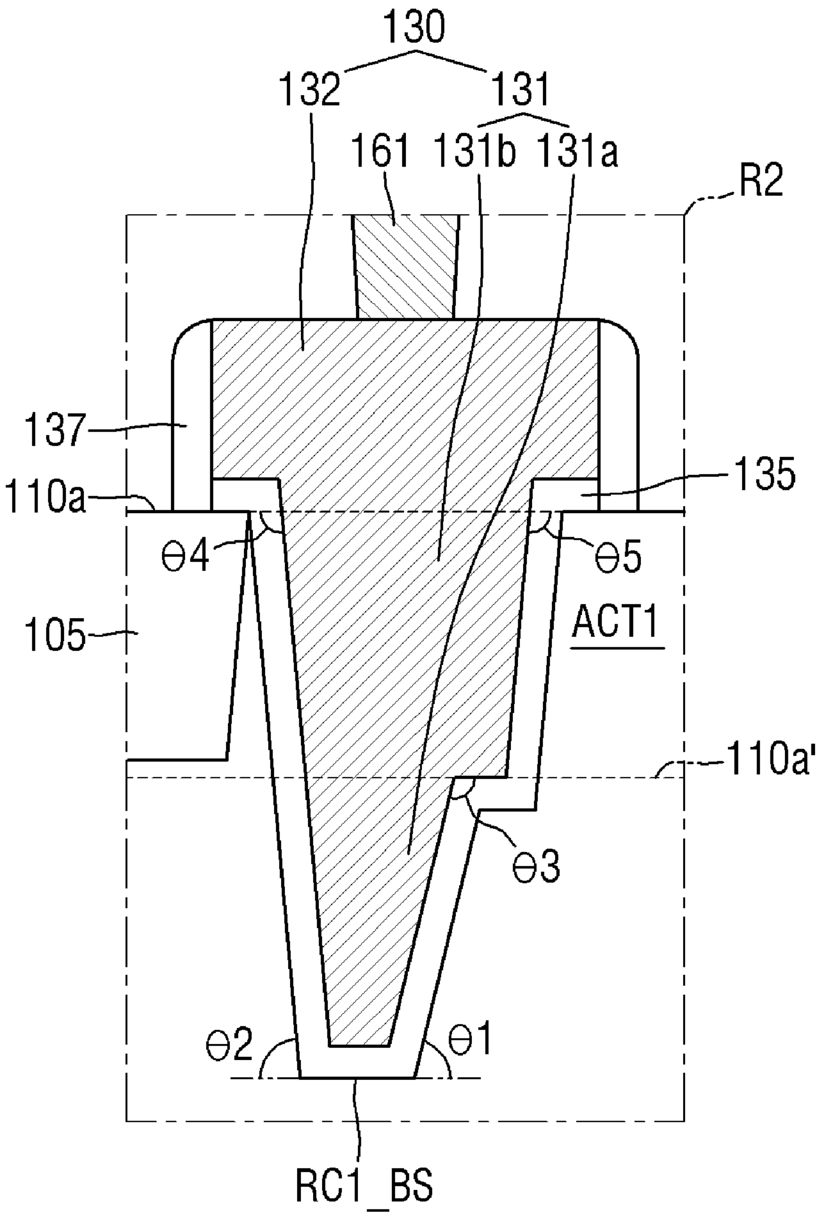
Figure 12:
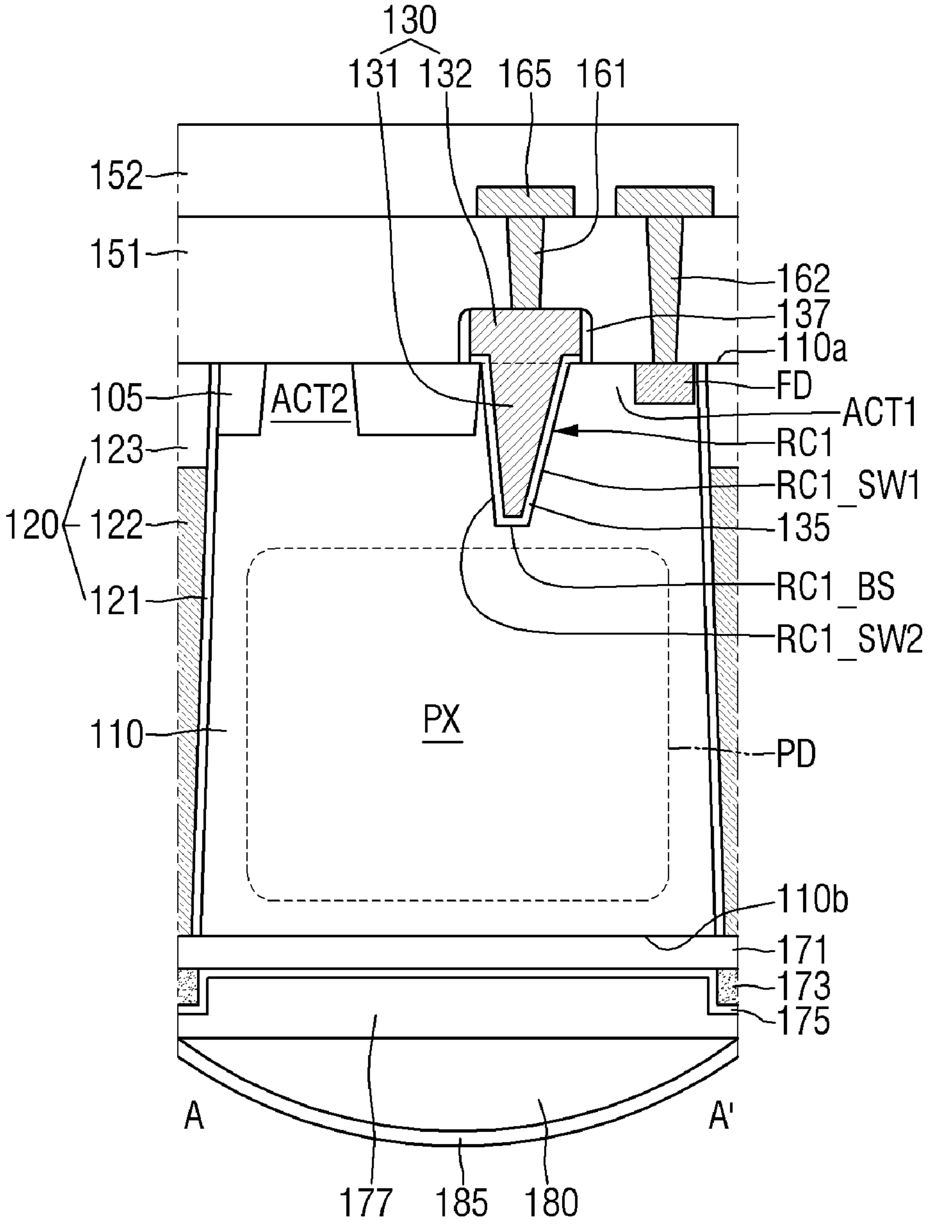

FIGS. 10 to 12 are diagrams of an image sensor according to some other example embodiments. For reference, FIGS. 10 and 12 may be example cross-sectional views taken along line A-A' of FIG. 6, and FIGS. 11A and 11B may be an enlarged view of a region R2 of FIG. 10. For convenience of explanation, repeated contents explained in the above-described embodiments will be omitted.

First, referring to FIGS. 10 and 11A, a first side wall RC1_SWa of the first recess RC1 may have a step. The side wall 131SW1 of the first extending part 131 that faces the floating diffusion region FD may have a step.

In FIG. 11A, the first portion RC1_SWla of the first side wall RC1_SWa and the second portion RC1_SW1*b* of the first side wall RC1_SWa may not be connected to each other. A connecting portion may be interposed between the first portion RC1_SWla and the second portion RC1_SW1*b*. While the connecting portion is shown to extend in a direction parallel to a horizontal direction, the inventive concept of the present disclosure is not limited thereto.

In some embodiments, the first sub-portion 131*a* of the first extending part 131 has a first width W1 at a boundary between the first sub-portion 131*a* and the second sub-portion 131*b* of the first extending part 131. The second sub-portion 131*b* has a second width W2At at the boundary between the first sub-portion 131*a* and the second sub-portion 131*b*. The first width W1 may be different from the second width W2. As an example, the first width W1 may be smaller than the second width W2. This may be because the first side wall RC1_SWa of the first recess RC1 has a step.

In some embodiments, both the lower part 131C1 of the central axis of the first extending part 131 and the upper part 131C2 of the central axis of the first extending part 131 may not extend in the vertical direction. The upper part 131C2 of the central axis of the first extending part 131 may be inclined toward the floating diffusion region FD. The upper part 131C2 of the central axis of the first extending part 131 may be an imaginary line that connects the center point of the upper surface of the first sub-portion 131*a* to the center point of the upper surface of the second sub-portion 131*b*.

Referring to FIG. 12, the slope of the first side wall RC1_SWa of the first recess RC1 may be constant from the bottom surface RC1_BS of the first recess RC1 toward the first surface 110*a* of the first substrate 110. The first side wall RC1_SWa of the first recess RC1 may not have a step.

Although not clearly shown, the slope of the side wall of the first extending part 131 may also be constant from the bottom surface RC1_BS of the first recess RC1 toward the first surface 110*a* of the first substrate 110. The central axis of the first extending part 131 may not extend in the vertical direction. The central axis of the first extending part 131 may be constant from the bottom surface RC1_BS of the first recess RC1 toward the first surface 110*a* of the first substrate 110. The central axis of the first extending part 131 may be inclined toward the floating diffusion region FD. An angle formed between the bottom surface RC1_BS of the first recess RC1 and the central axis of the first extending part 131 may be smaller than 90°.

Figure 13:
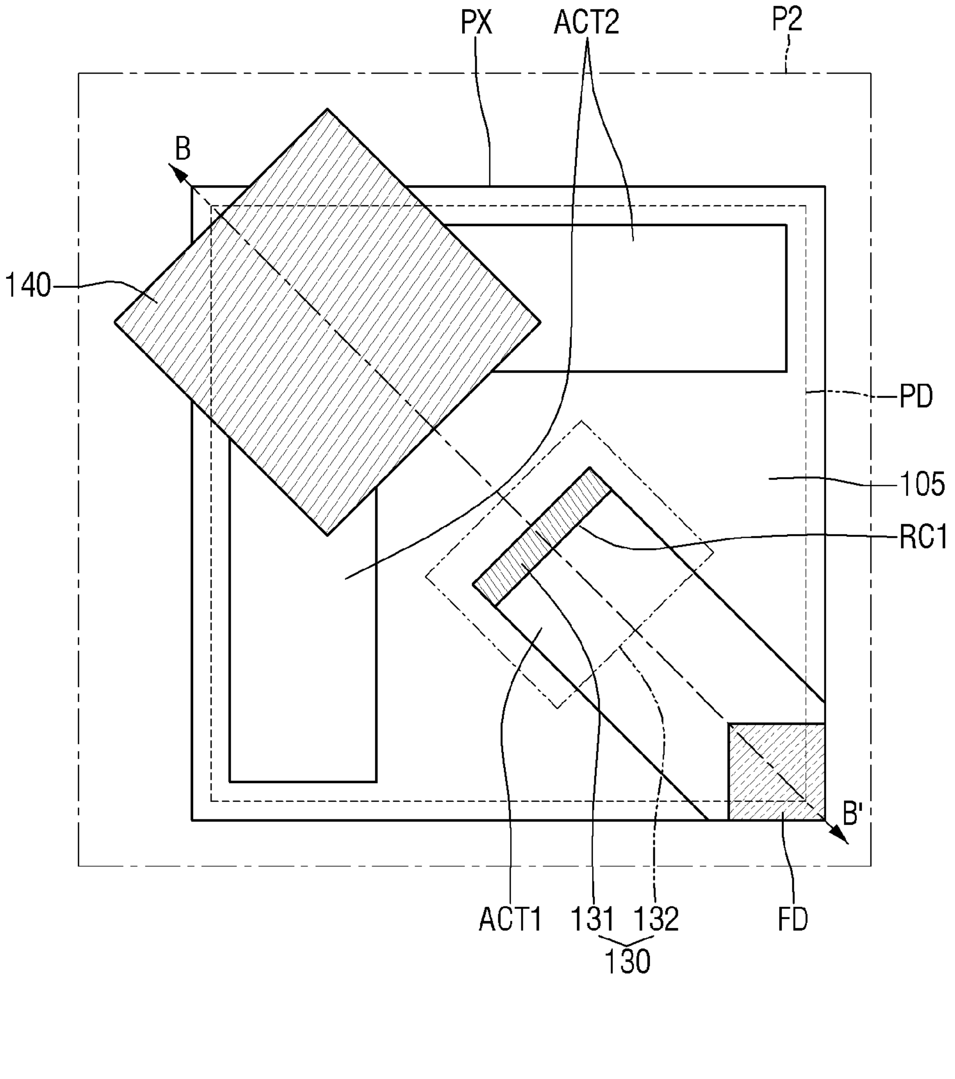
FIGS. 13 to 15 are diagrams of an image sensor according to some example embodiments.
Figure 14:
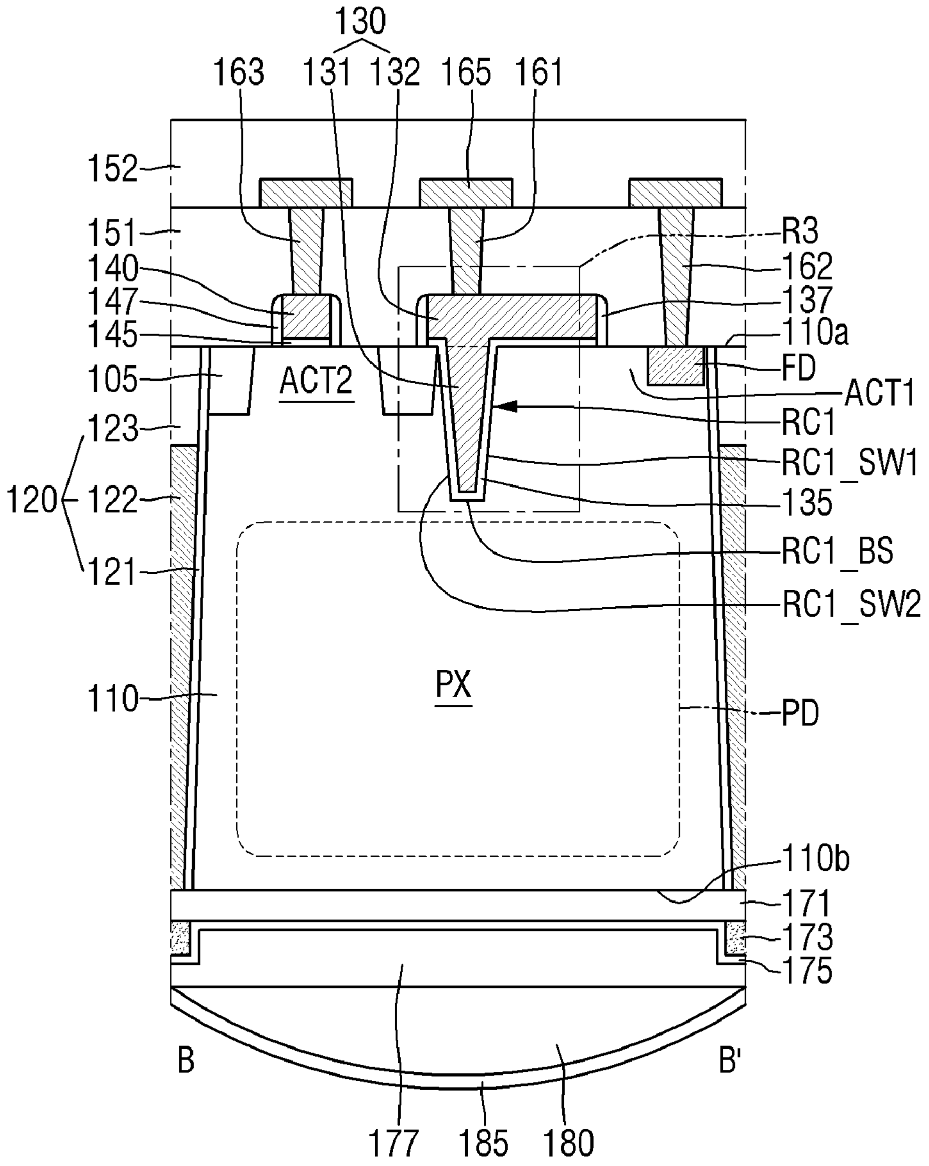
Figure 15:
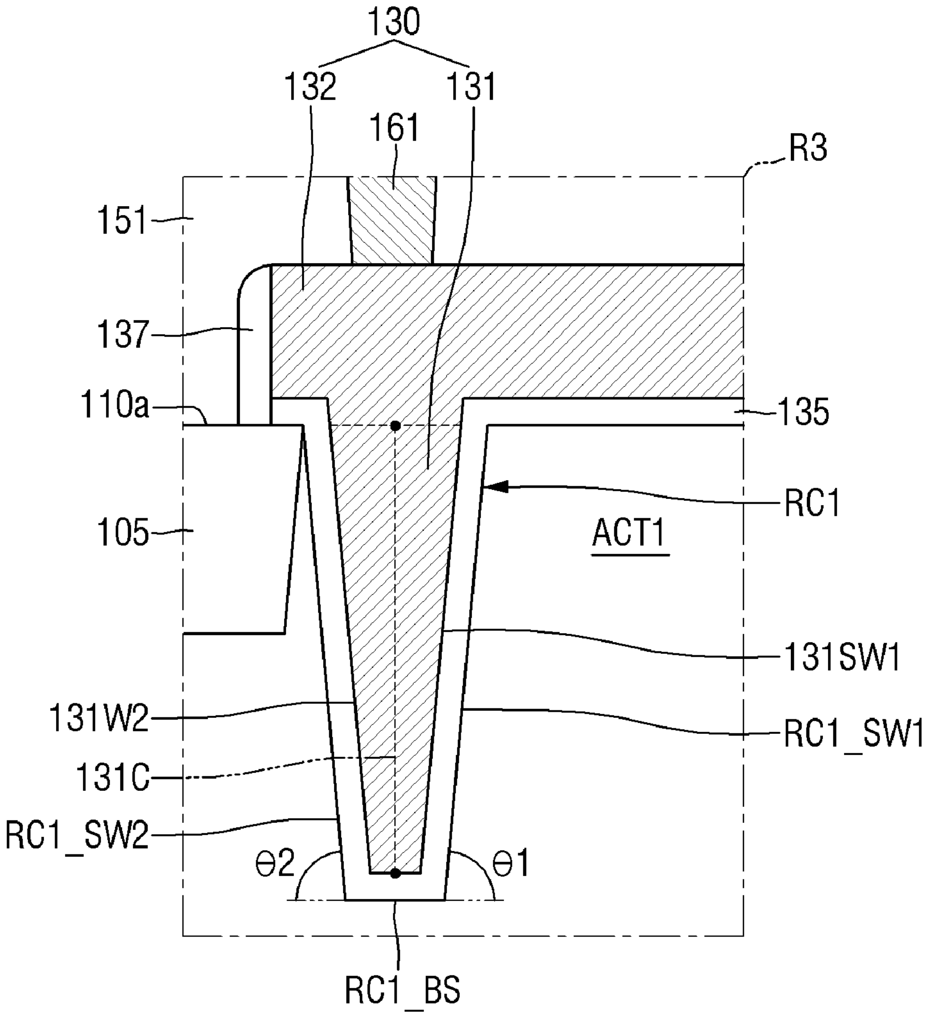

FIGS. 13 to 15 are diagrams of an image sensor according to some other example embodiments. For reference, FIG. 13 may be an example enlarged view of the region P2 of FIG. 5. FIG. 14 may be an example cross-sectional view taken along line B-B' of FIG. 13. FIG. 15 may be an example enlarged view of a region R3 of FIG. 14. FIG. 13 may also be a conceptual view to help understanding of some example embodiments, and therefore, not all elements shown in FIG. 13 may be shown when viewed from an observation direction (e.g., from the top). For convenience of explanation, repeated contents explained in the above-described embodiments will be omitted.

Referring to FIGS. 13 to 15, from a viewpoint of a plan view, the shape of the first recess RC1 may be a slim bar shape. From the viewpoint of a plan view, the first extending part 131 may have a slim rod shape. The slim bar shape may mean that a length of the short side is smaller than a length of the long side. As an example, the length of the long side may be four times or more greater than the length of the short side, but the inventive concept of the present disclosure is not limited thereto.

From the viewpoint of a plan view, the first recess RC1 may have a short side in a direction of facing toward the floating diffusion region FD. From the viewpoint of a plan view, the first extending part 131 may have a short side in a direction of facing toward the floating diffusion region FD.

In FIG. 15, the slope of the first side wall RC1_SWa of the first recess RC1 may be constant from the bottom surface RC1_BS of the first recess RC1 toward the first surface 110*a* of the first substrate 110.

An angle between the bottom surface RC1_BS of the first recess RC1 and the first side wall RC1_SW1 may be a first angle θ1. An angle between the bottom surface RC1_BS of the first recess RC1 and the second side wall RC1_SW2 may be a second angle θ2. The first angle θ1 may be the same as the second angle θ2. Further, the central axis 131C of the first extending part 131 may extend in the vertical direction.

In FIG. 14, the image sensor according to some embodiments may further include a third contact 163, a gate insulating film 145, and a gate spacer 147.

The gate insulating film 145 may be interposed between the gate electrode 140 and the second active region ACT2. The gate spacer 147 may be provided along side walls of gate electrode 140. The third contact 163 may be provided on the gate electrode 140. The third contact 163 may electrically connect the first wiring pattern 165 and the gate electrode 140.

Figure 16:
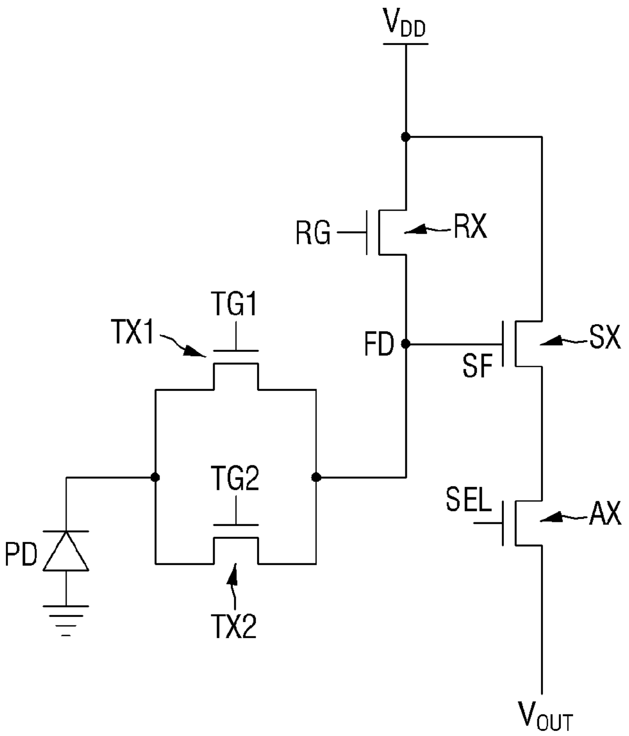
FIGS. 16 to 21 are diagrams of an image sensor according to some example embodiments.
Figure 17:
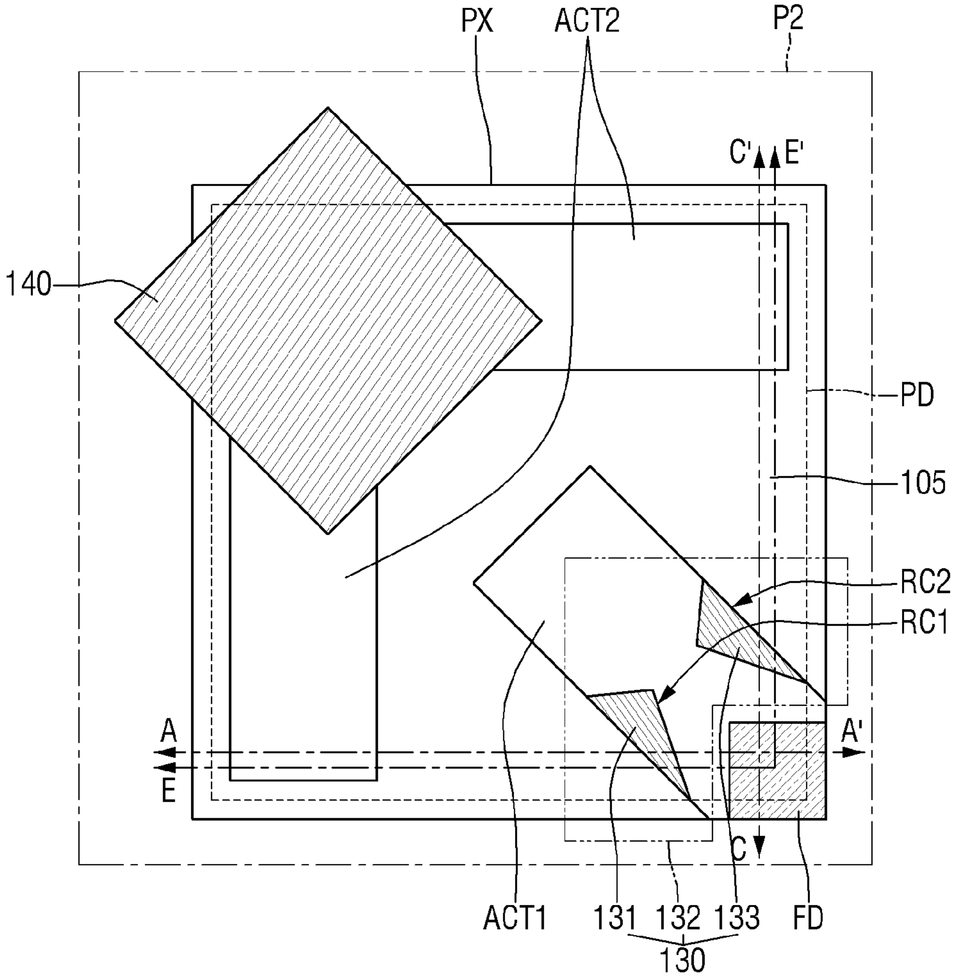

FIGS. 16 to 21 are diagrams of an image sensor according to some other example embodiments. For reference, FIG. 16 may be a circuit diagram for explaining the unit pixel region, FIG. 17 may be an example enlarged view of the region P2 of FIG. 5, FIGS. 18 to 30 may be example cross-sectional views taken along lines A-A' and C-C' of FIG. 17, and FIG. 21 may be an example cross-sectional view taken along line E-E' of FIG. 17. FIG. 17 may also be a conceptual view to help understanding of some example embodiments, and therefore, not all elements shown in FIG. 17 may be shown when viewed from an observation direction (e.g., from the top). For convenience of explanation, repeated contents explained in the above-described embodiments will be omitted.

Referring to FIG. 16, in the image sensor according to some embodiments, the pixel array includes a photoelectric conversion layer PD, a plurality of transfer transistors TX1 and TX2, a floating diffusion region FD, a reset transistor RX, a source follower transistor SX, and a selection transistor AX.

The plurality of transfer transistors TX1 and TX2 may be provided in one unit pixel region. The plurality of transfer transistors TX1 and TX2 may include a plurality of transfer gate electrodes TG1 and TG2, respectively. While the transfer gate electrodes TG1 and TG2 may electrically share one floating diffusion region FD, the inventive concept of the present disclosure is not limited thereto.

Figure 18:
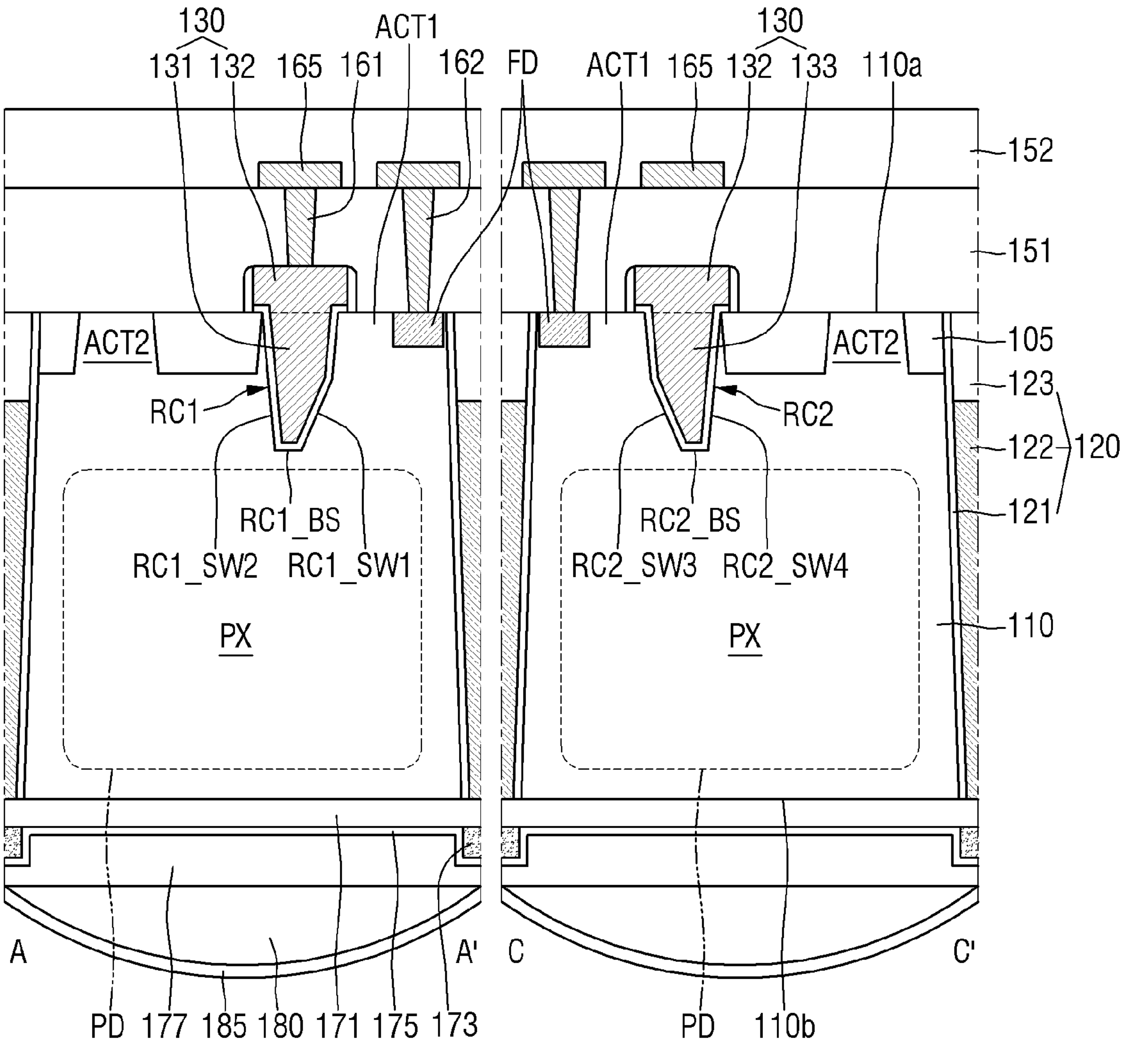

Referring to FIGS. 17 and 18, the image sensor according to some embodiments may further include a second recess RC2. The second recess RC2 may be symmetrical with the first recess RC1 based on the floating diffusion region FD. The second recess RC2 may be provided in the first active region ACT1. The second recess RC2 may extend in the vertical direction on the first surface 110*a* of the first substrate 110. The second recess RC2 may be formed by etching the first substrate 110 formed of silicon.

The transfer gate electrode 130 may further include a second extending part 133. That is, the transfer gate electrode 130 may include the first extending part 131, the second extending part 133, and the connecting part 132. The first extending part 131 and the second extending part 133 may be buried inside the first substrate 110. The connecting part 132 may be provided on the first surface 110*a* of the first substrate 110. The connecting part 132 may be connected to the first extending part 131 and the second extending part 133.

The second extending part 133 may be buried inside the first substrate 110. The second extending part 133 may be provided inside the second recess RC2. The second extending part 133 may fill the second recess RC2 that remains after the transfer gate insulating film 135 fills the second recess RC2.

The second recess RC2 may include a bottom surface RC2_BS, a third side wall RC2_SW3, and a fourth side wall RC2_SW4.

The third side wall RC2_SW3 of the second recess RC2 may face the floating diffusion region FD. The fourth side wall RC2_SW4 of the second recess RC2 may be opposite to the floating diffusion region FD. The fourth side wall RC2_SW4 of the second recess RC2 may be opposite to the third side wall RC2_SW3.

The bottom surface RC2_BS of the second recess RC2 may connect the third side wall RC2_SW3 and the fourth side wall RC2_SW4. The bottom surface RC2_BS of the second recess RC2 may be provided on the same plane as the bottom surface RC1_BS of the first recess RC1. However, the inventive concept of the present disclosure is not limited thereto.

In some embodiments, the second recess RC2 may be substantially the same as the first recess RC1. Although not shown, an angle between the bottom surface RC2_BS of the second recess RC2 and the third side wall RC2_SW3 may be a sixth angle. An angle between the bottom surface RC2_BS of the second recess RC2 and the fourth side wall RC2_SW4 may be a seventh angle. The sixth angle may be smaller than the seventh angle. That is, the slope of the third side wall RC2_SW3 connected to the bottom surface RC2_BS of the second recess RC2 may be smaller than the slope of the fourth side wall RC2_SW4. Accordingly, a distance from the photoelectric conversion layer PD to the floating diffusion region FD may decrease, compared to a case in which such a configuration is not provided. Accordingly, the transfer efficiency of the transfer transistor TX may be improved.

Referring to FIGS. 17 and 18, the image sensor according to some embodiments may further include the second extending part at the transfer gate electrode. The second extending part extended from the first surface into the substrate. The second extending part comprises a sixth surface and a seventh surface facing the sixth surface. And the seventh surface, the sixth surface, and the floating diffusion region are sequentially arranged in a second direction parallel to the first surface of the substrate.

In some embodiments, the second extending part may include an eighth angle and a ninth angle. The sixth surface has the eighth angle with respect to the first surface of the substrate and the seventh surface has the ninth angle with respect to the first surface of the substrate. And the eighth angle is different from the ninth angle.

In some embodiments, the second extending part may have a shape of a bar when viewed in a plan view, the eighth angle is equal to the ninth angle.

Although not shown, the second extending part 133 may include a central axis. The central axis of the second extending part 133 may be an imaginary line that connects imaginary points, each of which has the same distance to side walls of the second extending part 133 at each vertical level.

In some embodiments, at least a part of the central axis of the second extending part 133 may not extend in the vertical direction. At least a part of the central axis of the second extending part 133 may be inclined toward the floating diffusion region FD. Since at least a part of the central axis of the second extending part 133 is inclined toward the floating diffusion region FD, the movement distance of charges from the photoelectric conversion layer PD to the floating diffusion region FD may be shortened.

Figure 19:
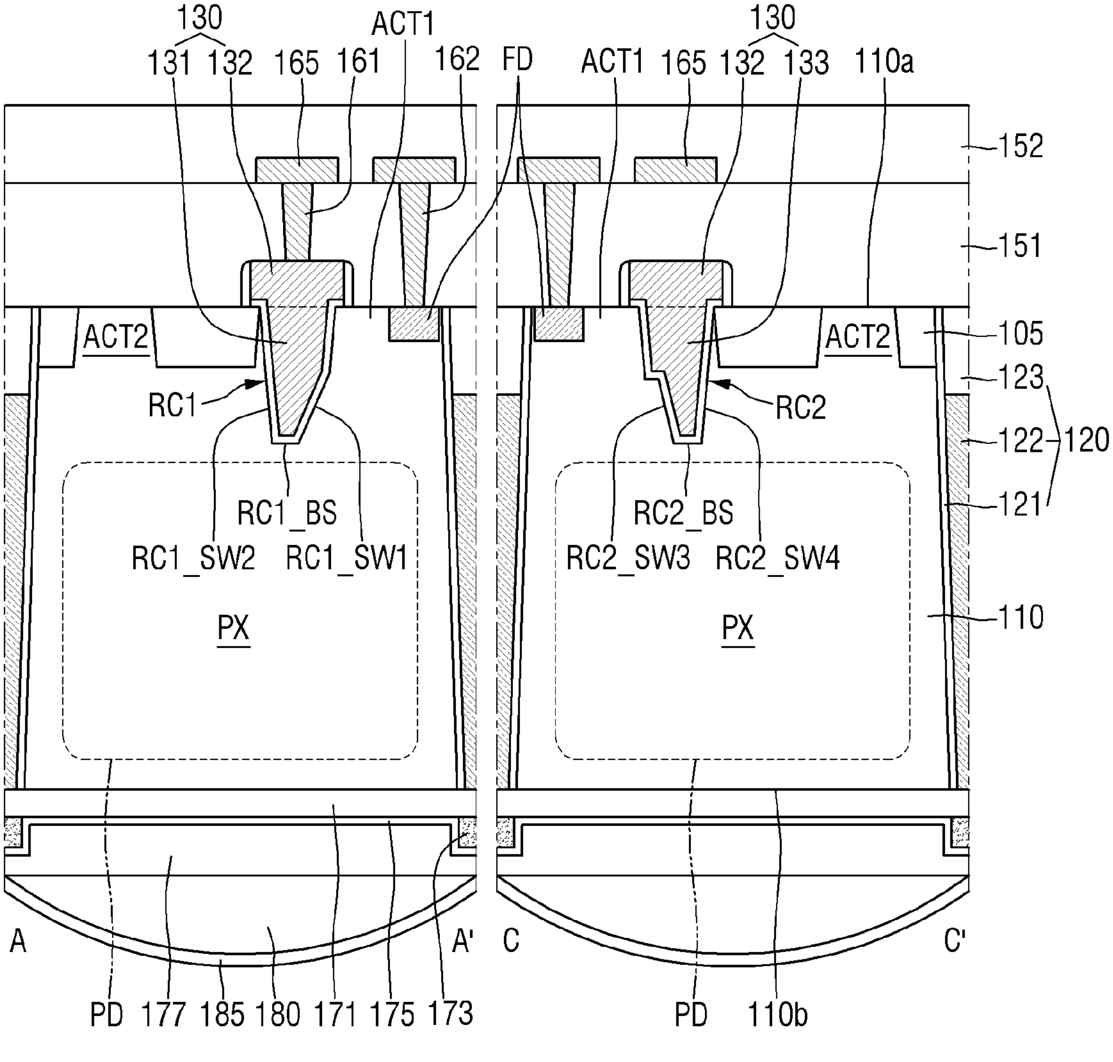

Referring to FIG. 19, from a viewpoint of a cross-sectional view (e.g., vertical view), the shape of the second recess RC2 may be different from the shape of the first recess RC1. For example, the first side wall RC1_SW1 of the first recess RC1 may not have a step, but the third side wall RC2_SW3 of the second recess RC2 may have a step. For example, the shape of the second recess RC2 that may have a step may be substantially the same as or similar to the shape of the first recess described in FIGS. 10 and 11A, and detailed contents will be omitted.

Figure 20:
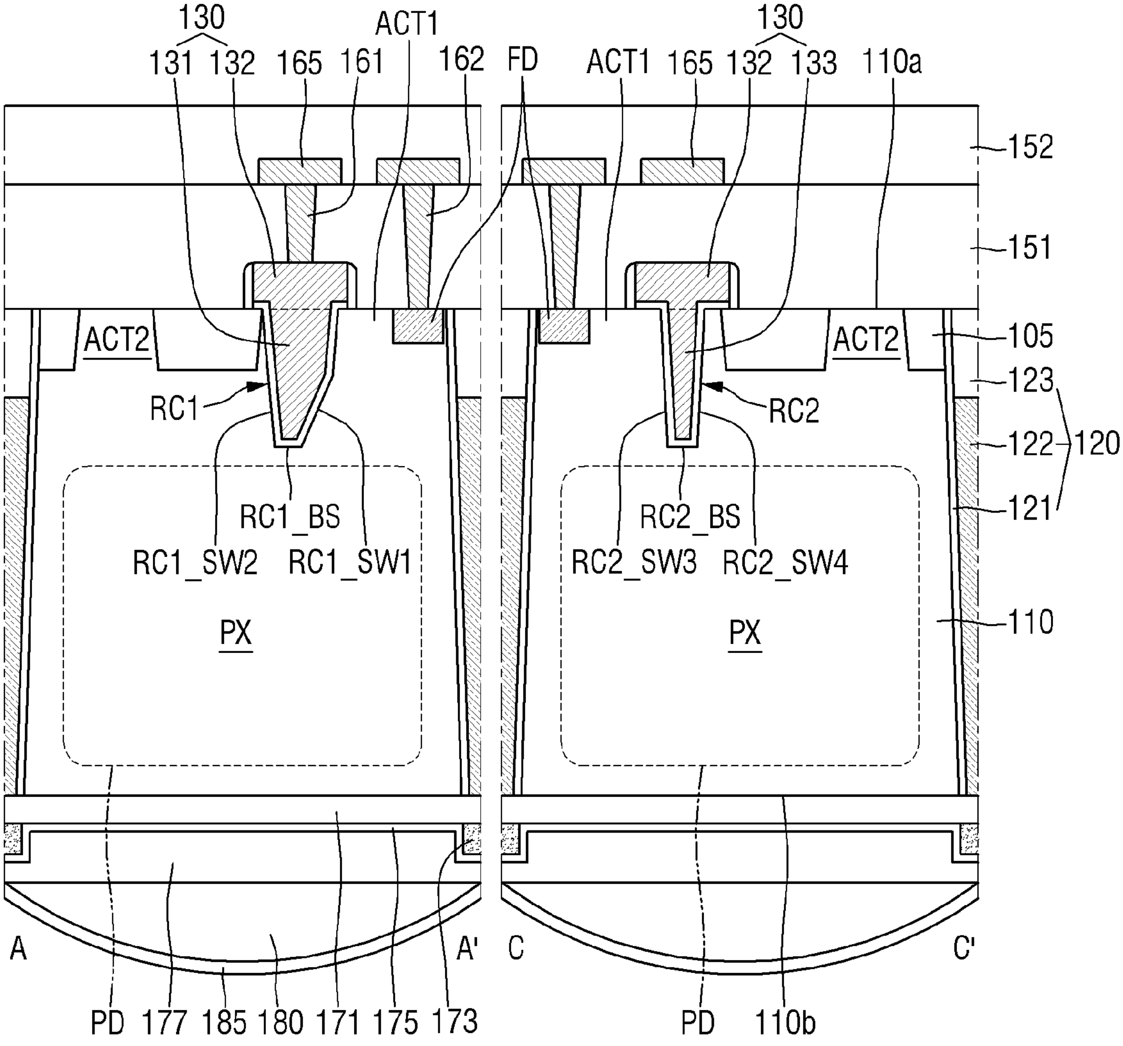

Referring to FIG. 20, from the viewpoint of a cross-sectional view, the shape of the second recess RC2 may be different from the shape of the first recess RC1. For example, the central axis of the second extending part 133 in the second recess RC2 may extend in the vertical direction. For example, the shape of the second recess RC2 may be substantially the same as or similar to the shape of the first recess described in FIG. 15, and detailed contents will be omitted.

Figure 21:
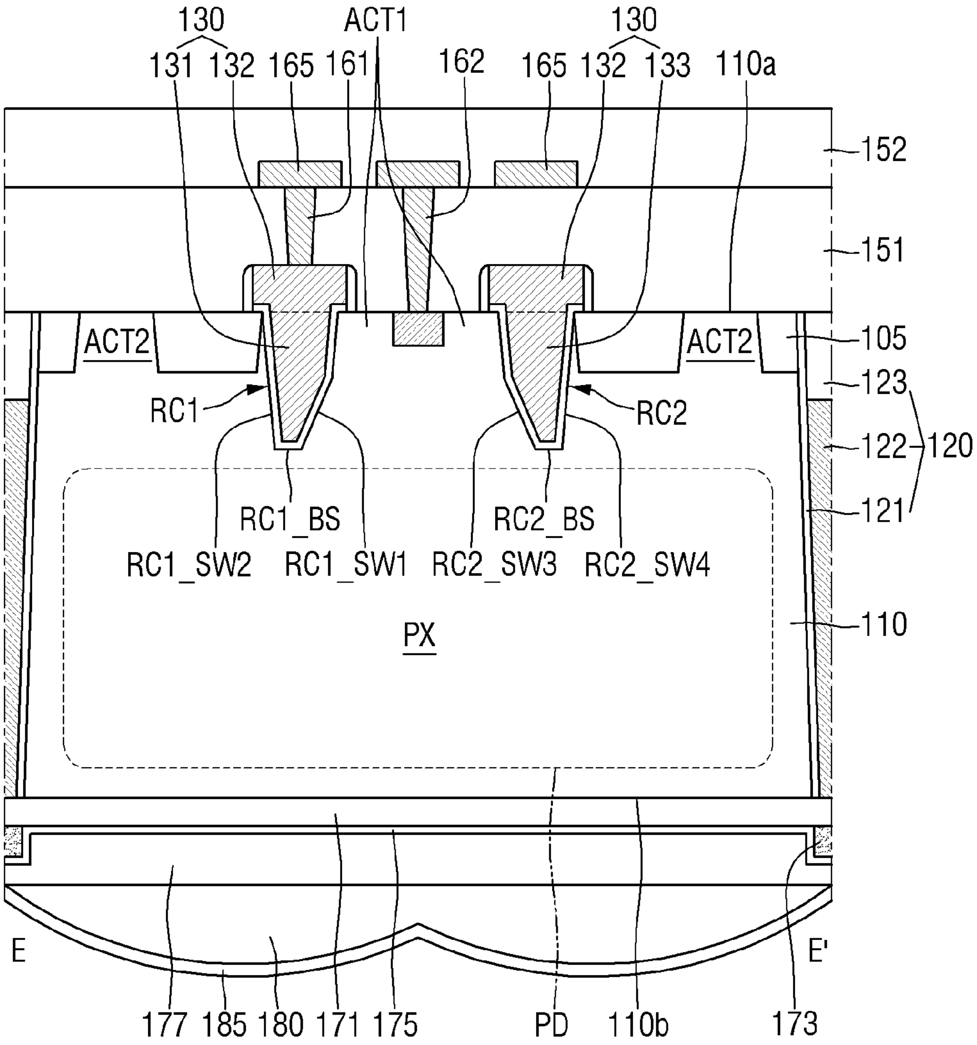

Referring to FIG. 21, the second recess RC2 may be symmetrical to the first recess RC1 based on the floating diffusion region FD. The second recess RC2 may be provided in the first active region ACT1.

As described above, two transfer gate electrodes 130 may be provided in one unit pixel region PX. The two transfer gate electrodes 130 may share one photoelectric conversion layer PD.

Figure 22:
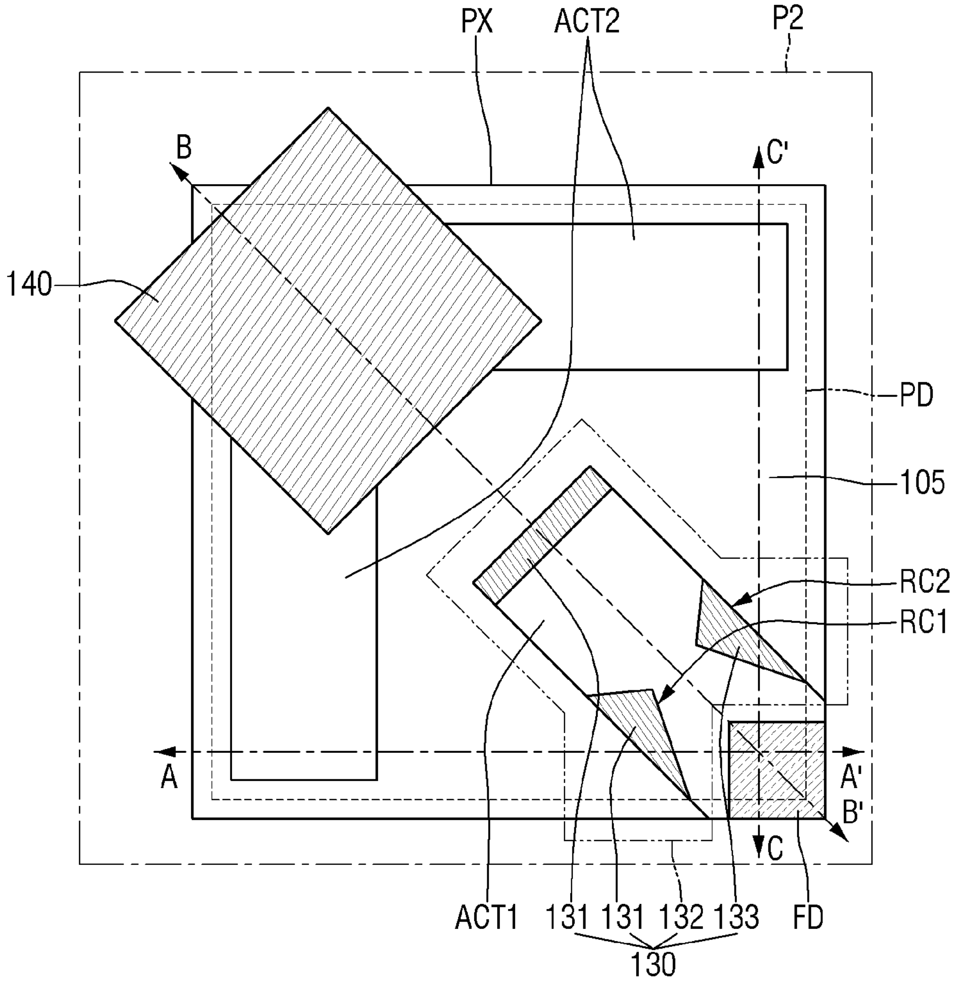
FIGS. 22 to 24 are diagrams of an image sensor according to some example embodiments.
Figure 23:
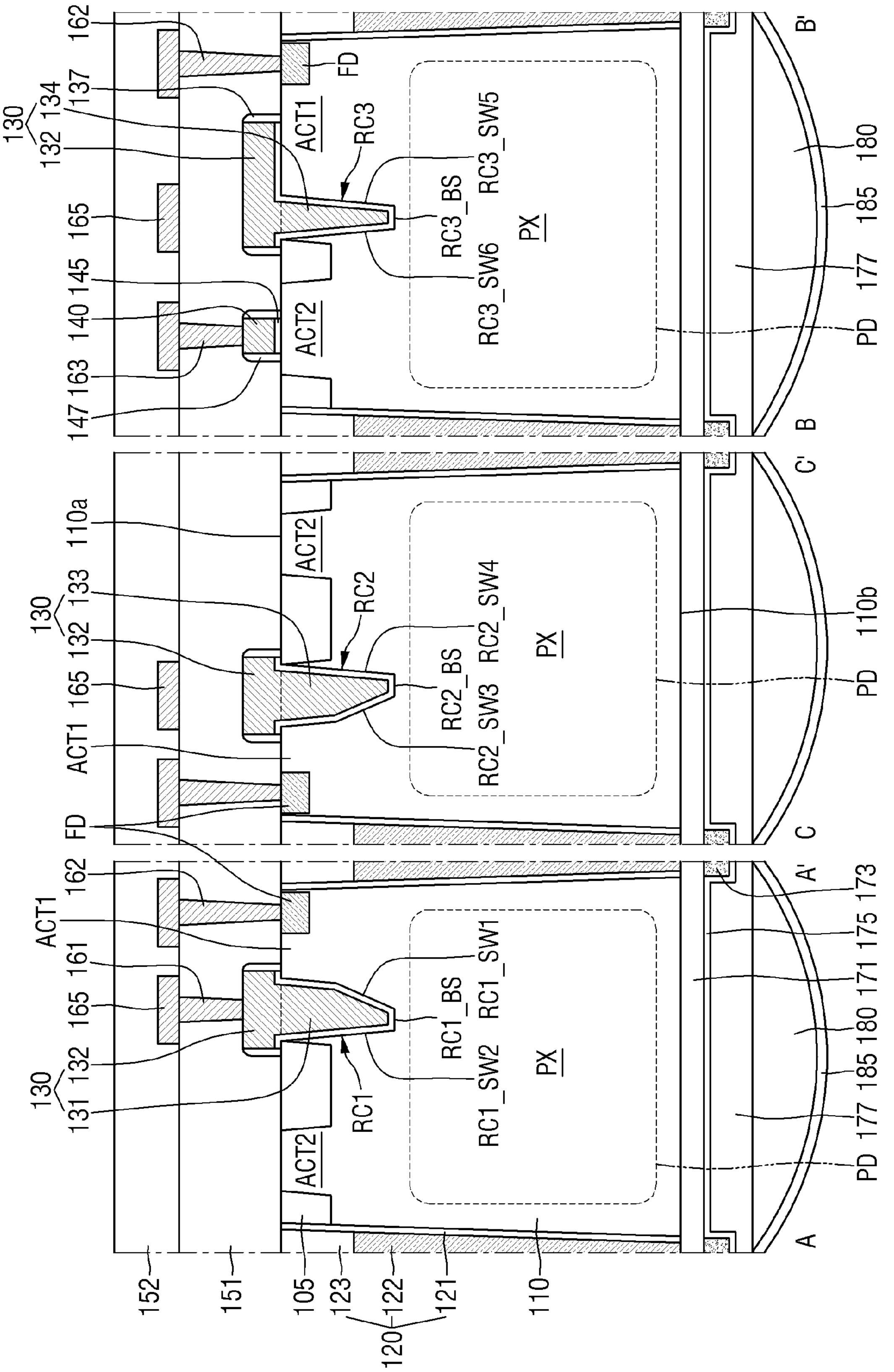
Figure 24:
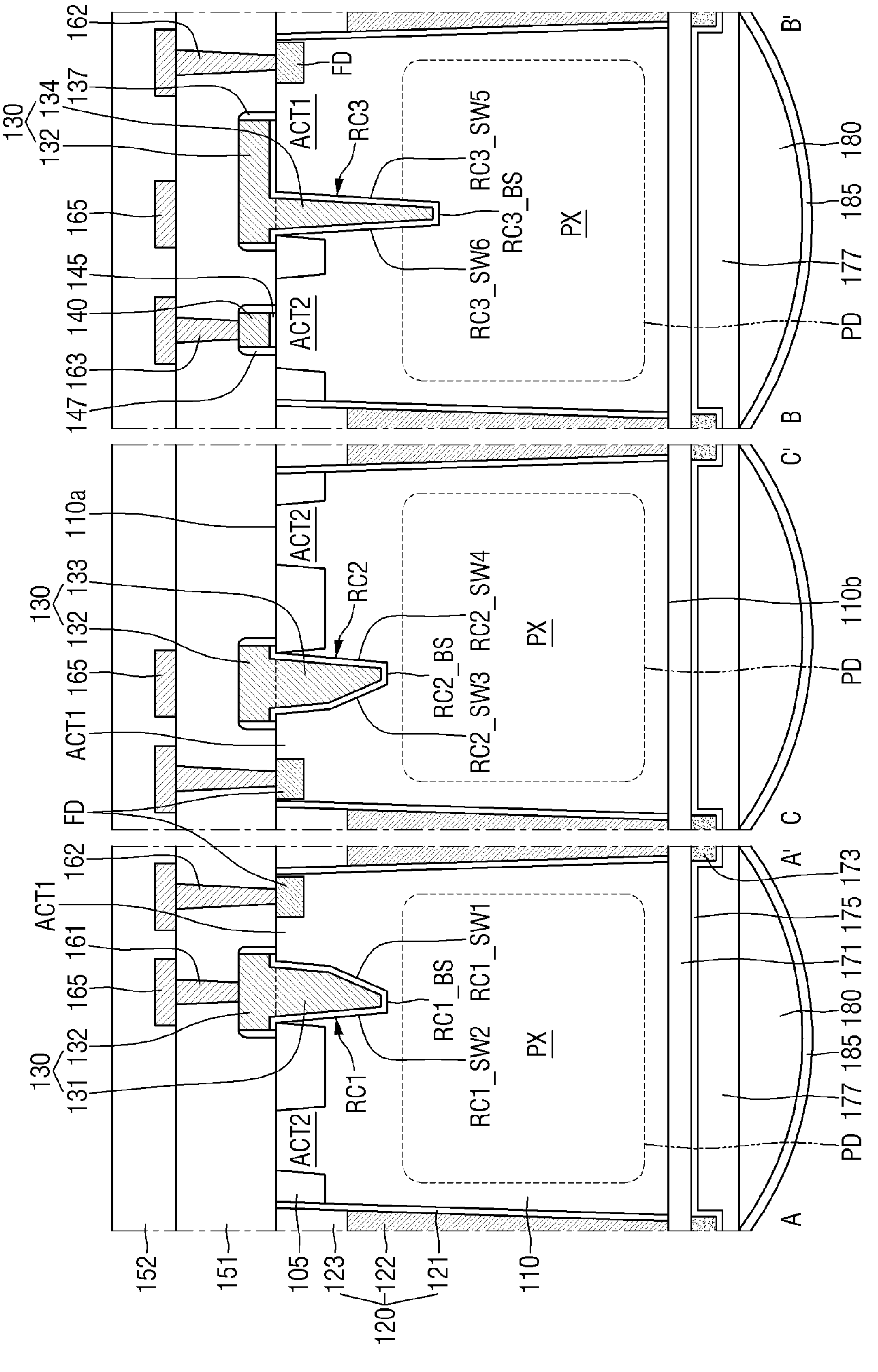

FIGS. 22 to 24 are diagrams of an image sensor according to some other example embodiments. FIG. 22 is an example enlarged view of the region P2 of FIG. 5, and FIGS. 23 and 24 may be example cross-sectional views taken along lines A-A', B-B' and C-C' of FIG. 22. FIG. 22 may also be a conceptual view to help understanding of some example embodiments, and therefore, not all elements shown in FIG. 22 may be shown when viewed from an observation direction (e.g., from the top). For convenience of explanation, repeated contents explained in the above-described embodiments will be omitted.

Referring to FIGS. 22 and 23, the image sensor according to some embodiments may further include a second recess RC2 and a third recess RC3.

The second recess RC2 may be symmetrical with the first recess RC1 based on the floating diffusion region FD. The third recess RC3 may be provided between the gate electrode 140 and the floating diffusion region FD. However, the placement of the first recess RC1, the second recess RC2, and the third recess RC3 may be changed as desired depending on the design of the product.

The second recess RC2 and the third recess RC3 may each be provided in the first active region ACT1. The second recess RC2 and the third recess RC3 may each extend in the vertical direction from the first surface 110*a* of the first substrate 110. The second recess RC2 and the third recess RC3 may each be formed by etching the first substrate 110 formed of silicon.

The transfer gate electrode 130 may further include a second extending part 133 and a third extending part 134. That is, the transfer gate electrode 130 may include the first extending part 131, the second extending part 133, the third extending part 134, and the connecting part 132. The first extending part 131, the second extending part 133, and the third extending part 134 may be buried inside the first substrate 110. The connecting part 132 may be provided on the first surface 110*a* of the first substrate 110. The connecting part 132 may be connected to the first connecting part 131, the second connecting part 133, and the third connecting part 134.

The second extending part 133 may be buried inside the first substrate 110. The second extending part 133 may be provided inside the second recess RC2. The second extending part 133 may fill the second recess RC2 that remains after the transfer gate insulating film 135 fills the second recess RC2. The third extending part 134 may be buried inside the first substrate 110. The third extending part 134 may be provided inside the third recess RC3. The third extending part 134 may fill the third recess RC3 that remains after the transfer gate insulating film 135 fills the third recess RC3.

The explanation of the second recess RC2 will be omitted since the second recess RC2 may be substantially the same as or similar to the second recess RC2 described in FIG. 17.

From a viewpoint of a plan view, the third recess RC3 may be in a shape of a slim bar. The third recess RC3 may include a bottom surface RC3_BS, a fifth side wall RC3_SW5, and a sixth side wall RC3_SW6.

The fifth side wall RC3_SW5 of the third recess RC3 may face the floating diffusion region FD. The sixth side wall RC3_SW6 of the third recess RC3 may be opposite to the floating diffusion region FD. The sixth side wall RC3_SW6 of the third recess RC3 may be opposite to the fifth side wall RC3_SW5.

The bottom surface RC3_BS of the third recess RC3 may connect the fifth side wall RC3_SW5 and the sixth side wall RC3_SW6. The bottom surface RC3_BS of the third recess RC3 may be provided on the same plane as the bottom surface RC1_BS of the first recess RC1 and the bottom surface RC2_BS of the second recess RC2. However, the inventive concept of the present disclosure is not limited thereto.

Although not clearly shown, the central axis of the third recess RC3 may not be inclined toward the floating diffusion region FD. An angle formed between the bottom surface RC3_BS of the third recess RC3 and the fifth side wall RC3_SW5 may be the same as an angle formed between the bottom surface RC3_BS of the third recess RC3 and the sixth side wall RC3_SW6.

Referring to FIG. 24, a vertical level of the bottom surface RC3_BS of the third recess RC3 may not be the same as vertical levels of the bottom surface RC1_BS of the first recess RC1 and the bottom surface RC2_BS of the second recess RC2. A distance from the first surface 110*a* of the first substrate 110 to the bottom surface RC3_BS of the third recess RC3 may be greater than a distance from the first surface 110*a* of the first substrate 110 to the bottom surface RC1_BS of the first recess RC1, and a distance from the first surface 110*a* of the first substrate 110 to the bottom surface RC2_BS of the second recess RC2.

At least a part of the third extending part 134 may be provided in the photoelectric conversion layer PD. Since at least a part of the third extending part 1 134 is provided in the photoelectric conversion layer PD, the transfer efficiency of the transfer transistor TX may be improved and/or enhanced. This is because the concentration of impurities in the photoelectric conversion layer PD is higher than the concentration of impurities outside the photoelectric conversion layer PD.

While FIGS. 23 and 24 show that the shape of the first recess RC1 and the shape of the second recess RC2 are substantially the same, and the shape of the third recess RC3 is a bar shape, the inventive concept of the present disclosure is not limited thereto. For example, the shapes of the first recess RC1, the second recess RC2, and the third recess RC3 may all be the same as or different from each other.

Figure 25:
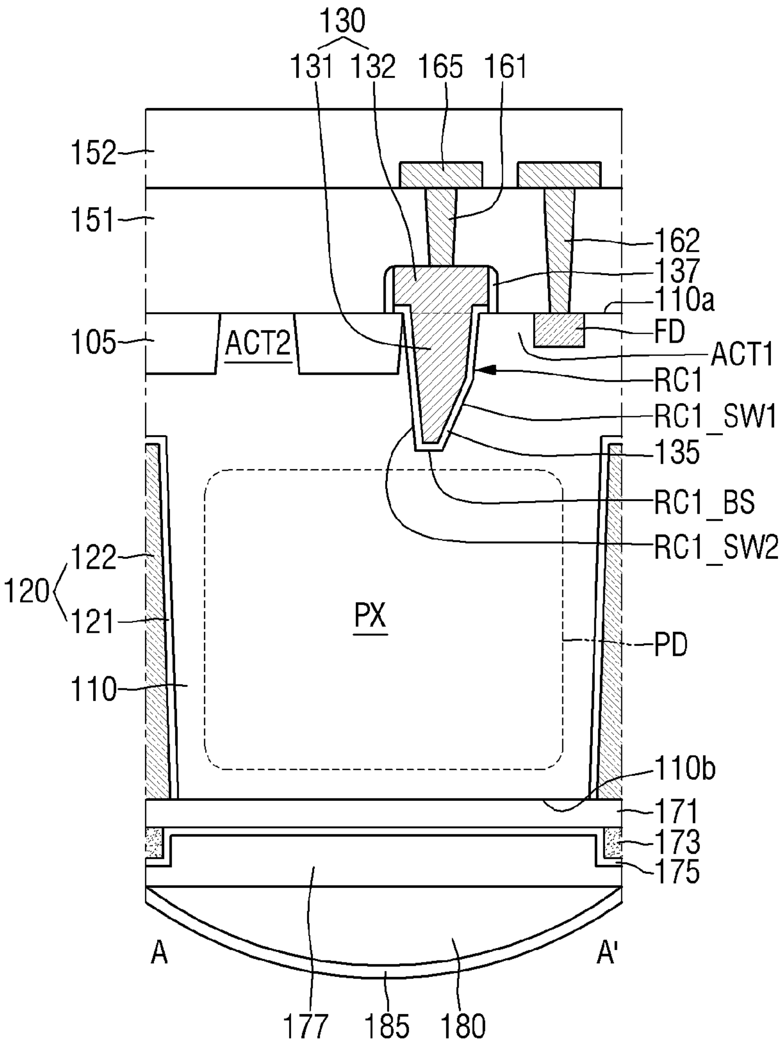
FIG. 25 is a diagram of an image sensor according to some example embodiments.

FIG. 25 is a diagram of an image sensor according to some other example embodiments.

Referring to FIG. 25, in the image sensor according to some embodiments, the pixel separation pattern 120 may be back deep trench isolation (BDTI).

The pixel separation pattern 120 may not completely penetrate the first substrate 110 in the vertical direction. The pixel separation pattern 120 extends from the second surface 110*b* of the first substrate 110 toward the first surface 110*a* in the vertical direction. However, the pixel separation pattern 120 may not extend to the first surface 110*a*. The pixel separation pattern 120 may not include a capping film.

Figure 26:
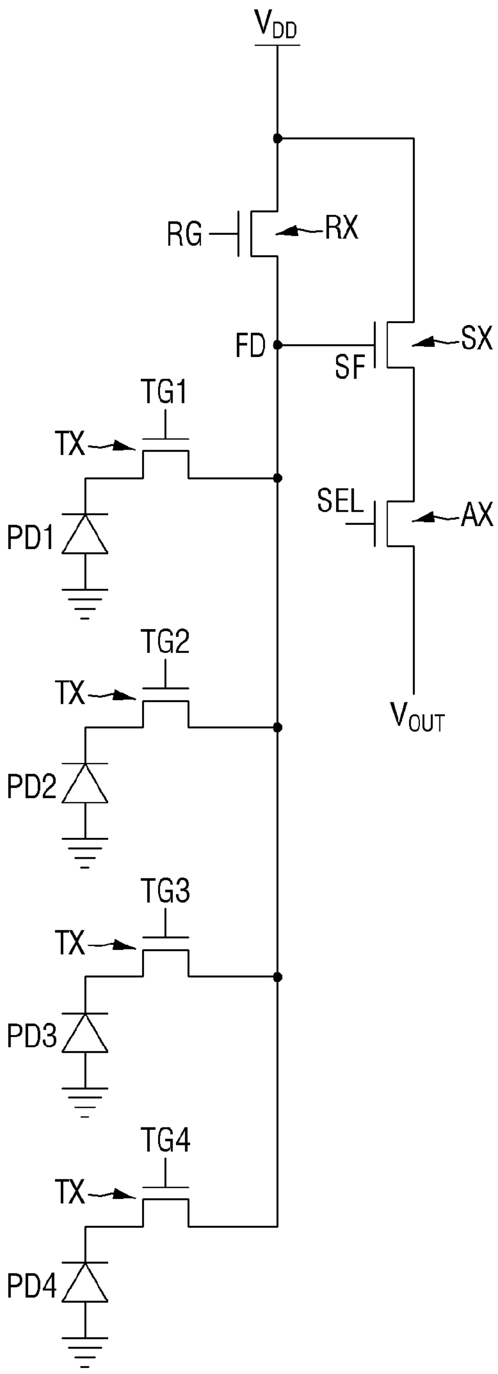
FIGS. 26 to 28 are diagrams of an image sensor according to some example embodiments.
Figure 27:
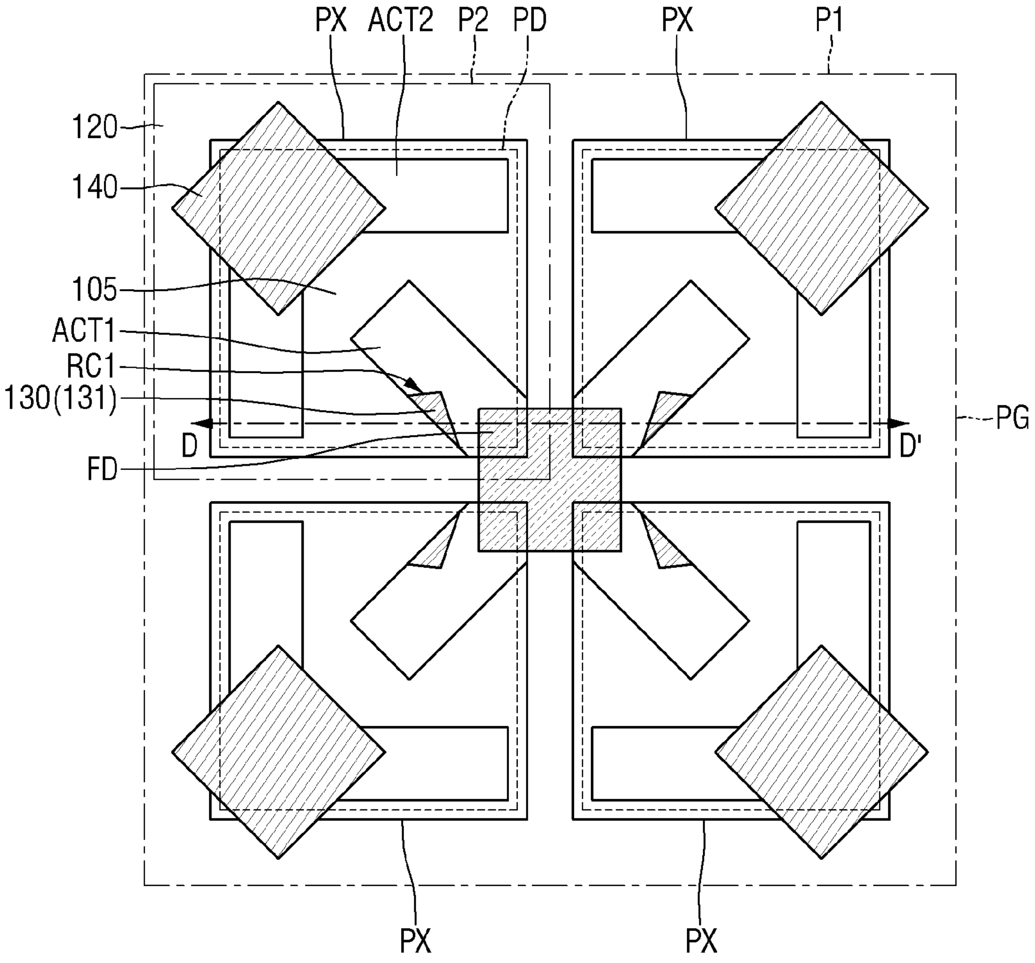
Figure 28:
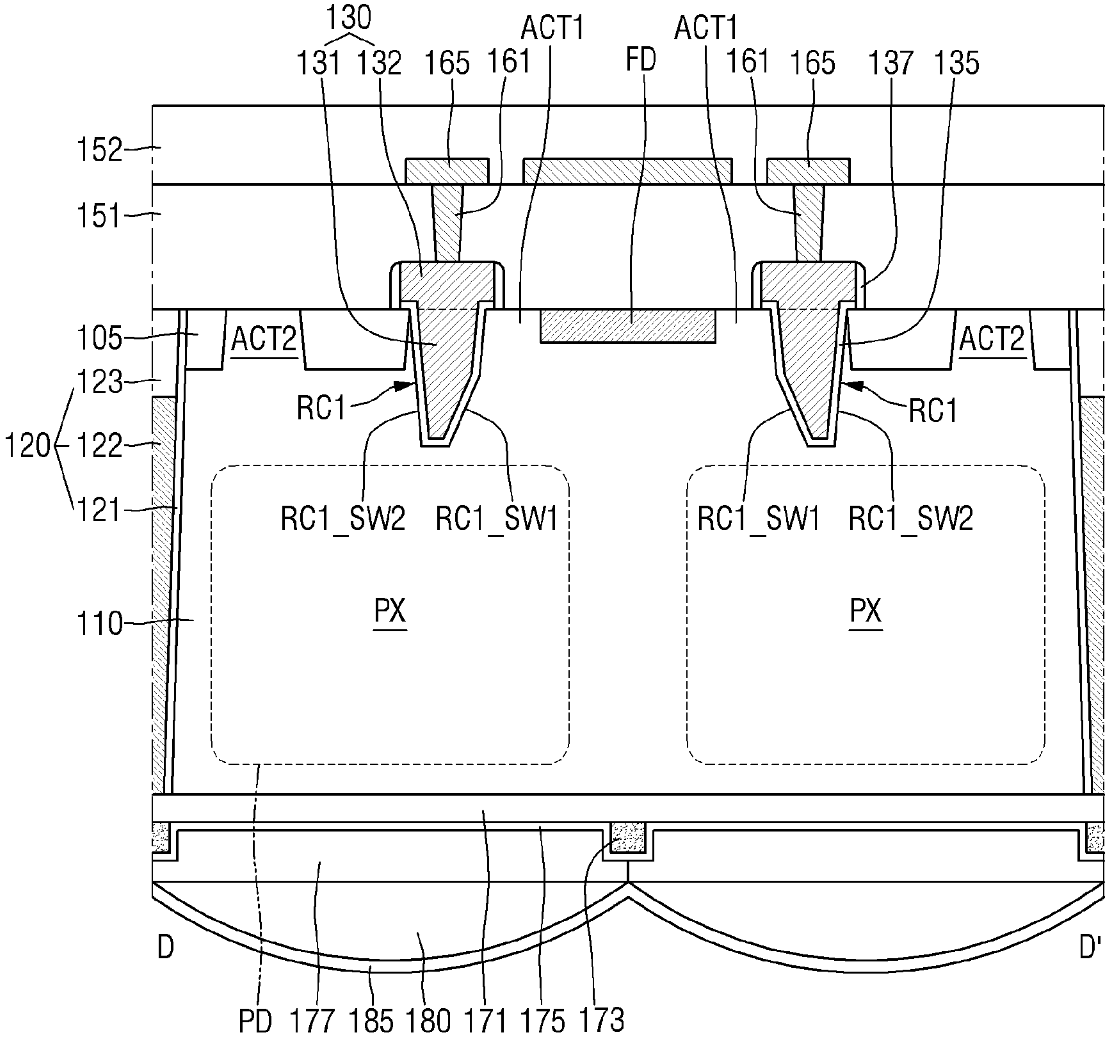

FIGS. 26 to 28 are diagrams of an image sensor according to some other example embodiments. FIG. 26 may be a circuit diagram of an image sensor according to some embodiments. FIG. 27 may be an example enlarged view of the region P1 of FIG. 4. FIG. 28 may be a cross-sectional view taken along line D-D' of FIG. 26. FIG. 27 may also be a conceptual view to help understanding of some example embodiments, and therefore, not all elements shown in FIG. 27 may be shown when viewed from an observation direction (e.g., from the top). For convenience of explanation, repeated contents explained in the above-described embodiments will be omitted.

First, referring to FIG. 26, in the image sensor according to some embodiments, the pixel array may include photoelectric conversion layers PD1, PD2, PD3 and PD4, a transfer transistor TX, a floating diffusion region FD, a reset transistor RX, a source follower transistor SX, and a selection transistor AX.

The photoelectric conversion layers PD1, PD2, PD3, and PD4 may electrically share one floating diffusion region FD. For example, while the four photoelectric conversion layers PD1, PD2, PD3, and PD4 may electrically share one floating diffusion region FD, the inventive concept of the present disclosure is not limited thereto.

Referring to FIGS. 27 and 28, the pixel groups PG may share one floating diffusion region FD. For example, the four unit pixel regions PX may share one floating diffusion region FD. The floating diffusion region FD may be provided over each of the four unit pixel regions PX. The floating diffusion region FD may be provided at the central portion of the pixel group PG. In some embodiments, the pixel separation pattern 120 may not be provided at a position that overlaps the floating diffusion region FD in the vertical direction.

Hereinafter, a method for fabricating an image sensor according to some embodiments will be described with reference to FIGS. 29 to 31.

Figure 29:
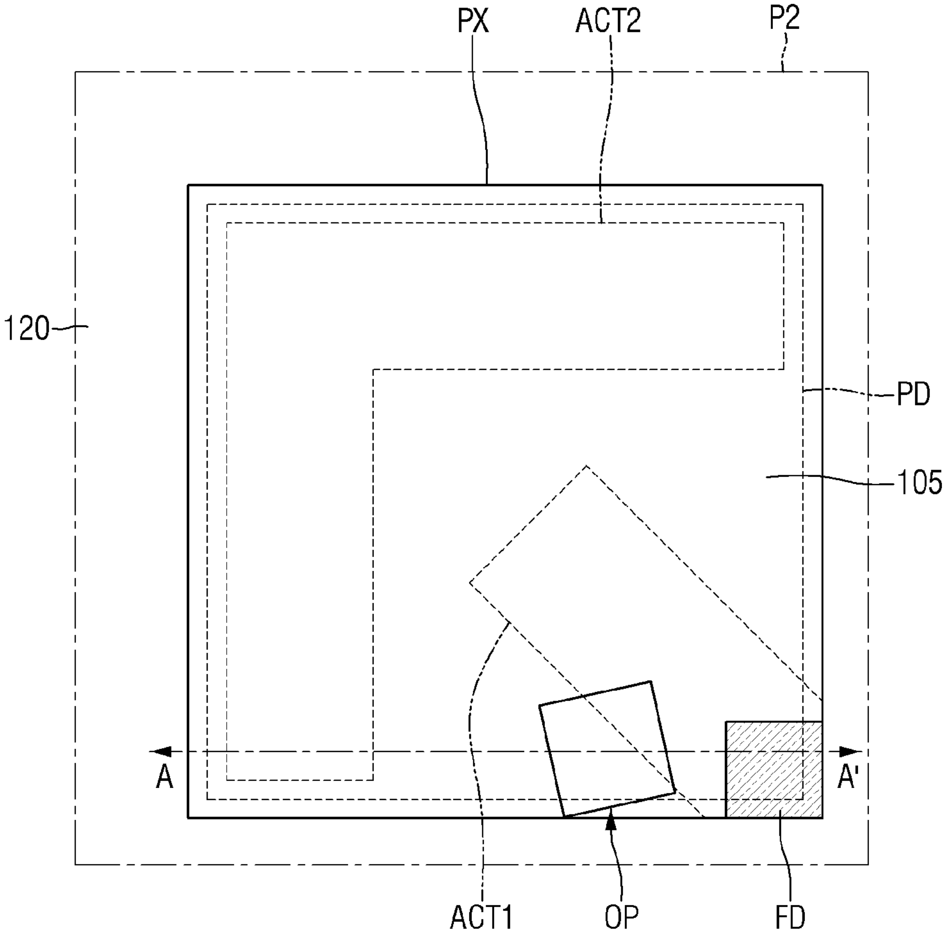
FIGS. 29 to 31 are intermediate stage diagrams for explaining a method for fabricating an image sensor according to some example embodiments.
Figure 30:
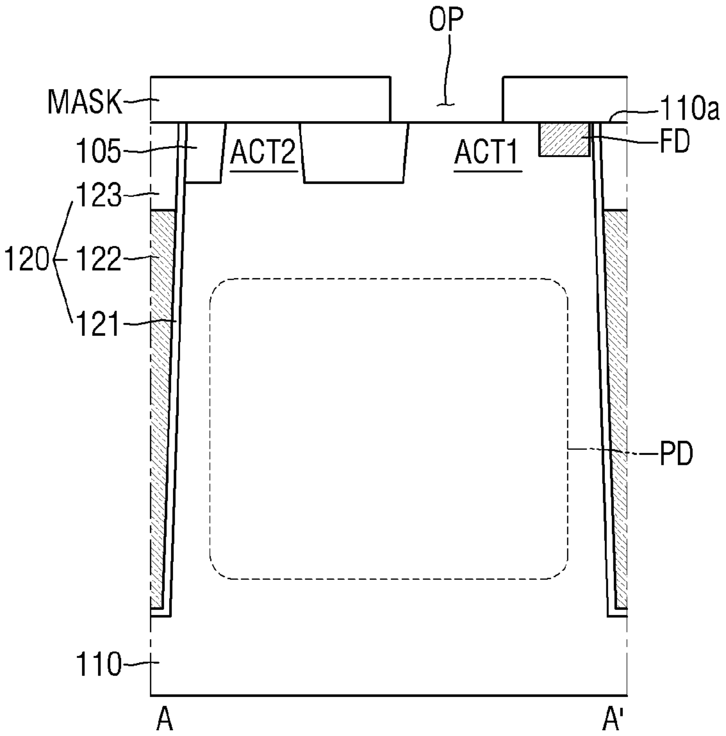
Figure 31:
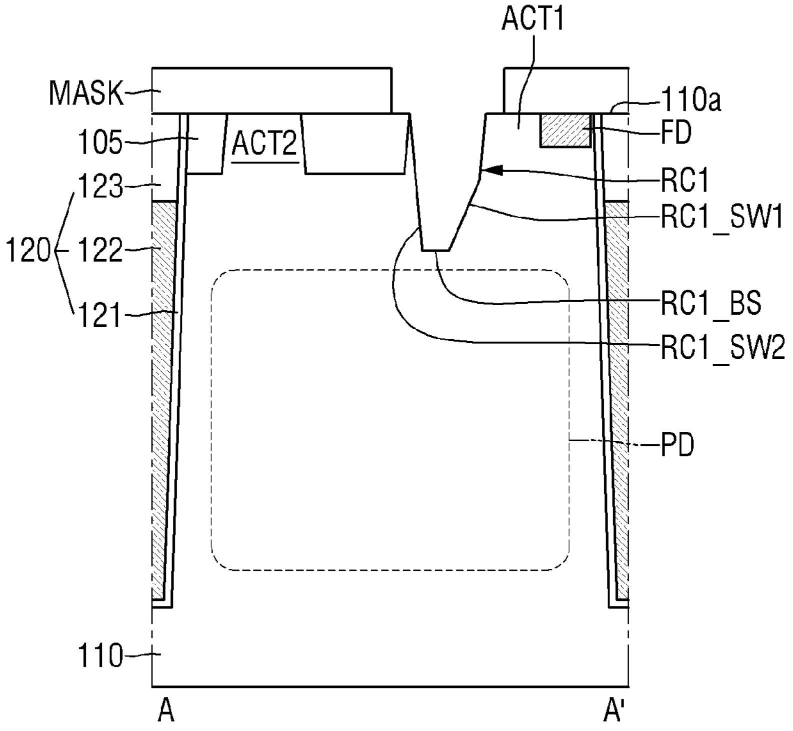

FIGS. 29 to 31 are intermediate stage diagrams for explaining a method for fabricating an image sensor according to some embodiments. For reference, FIGS. 30 and 31 are cross-sectional views taken along line A-A' of FIG. 29, respectively. For convenience of explanation, repeated contents explained in the above-described embodiments will be omitted.

Referring to FIGS. 29 and 30, the first substrate 110 may be provided. The photoelectric conversion layer PD may be formed in the first substrate 110. The element separation pattern 105 that defines the first active region ACT1 and the second active region ACT2 may be formed in the first substrate 110. The pixel separation pattern 120 that defines the unit pixel region PX may be formed in the first substrate 110.

The pixel separation pattern 120 may not completely penetrate the first substrate 110. First, a plurality of transistors and a plurality of wirings are first formed on the first surface 110*a* of the first substrate 110, and then a part of the first substrate 110 may be removed to expose the conductive film 122 of the pixel separation pattern 120. The floating diffusion region FD may be formed in the first substrate 110.

Subsequently, a mask film MASK may be formed on the first surface 110*a* of the first substrate 110. The mask film MASK may include an opening OP. At least a part of the opening OP of the mask film MASK may overlap the element separation pattern 105 in the vertical direction. Another part of the opening OP of the mask film MASK may overlap the first active region ACT1 in the vertical direction.

Referring to FIG. 31, the first substrate 110 may be etched, by using the mask film MASK as an etching mask. The first recess RC1 may be formed by etching the first substrate 110. While the first substrate 110 is being etched, the element separation pattern 105 is not etched.

In some embodiments, the first substrate 110 may be etched in proportion to the magnitude of an area exposed by the opening OP. For example, the larger the area exposed by the opening OP is, the more the first substrate 110 may be etched. Accordingly, the depth of the first recess RC1 may be changed. Accordingly, the profile of the side wall of the first recess RC1 may be changed.

For example, the slope of the first side wall RC1_SW1 of the first recess RC1 may be smaller than the slope of the second side wall RC1_SW2 of the first recess RC1.

Next, referring back to FIG. 7, the transfer gate insulating film 135 and the transfer gate electrode 130 that fill the first recess RC1 may be formed.

In concluding the detailed description, those skilled in the art would appreciate that many variations and modifications may be made to the example embodiments without substantially departing from the principles of the present disclosure. Therefore, the disclosed example embodiments of the disclosure are used in a generic and descriptive sense only and not for purposes of limitation.

What is claimed is:

1. An image sensor comprising:

a substrate including a first surface and a second surface opposite to the first surface;

a plurality of unit pixel regions provided in the substrate, each unit pixel region of the plurality of unit pixel regions including a photoelectric conversion layer, a floating diffusion region, and a transfer gate electrode; and a microlens on the second surface of the substrate, wherein the transfer gate electrode comprises a first connection part on the first surface and a first extending part connected to the first connection part and extending from the first surface into the substrate, wherein the first extending part comprises a third surface and a fourth surface facing the third surface, wherein the third surface has a first angle with respect to the first surface of the substrate and the fourth surface has a second angle with respect to the first surface of the substrate, wherein the fourth surface, the third surface, and the floating diffusion region are sequentially disposed in a first direction parallel to the first surface of the substrate, and wherein the first angle is greater than the second angle, wherein the first extending part has a first width in the first direction on the first surface of the substrate and has a second width in the first direction at a bottom of the first extending part, wherein the first width is greater than the second width, and wherein the bottom of the first extending part is a closest part among the first extending part from the second surface of the substrate.

2. The image sensor of claim 1, wherein the third surface is spaced apart from the first surface of the substrate.

3. The image sensor of claim 2, wherein the first extending part further comprises a fifth surface, wherein the fifth surface has a third angle with respect to the first surface of the substrate, and wherein the third angle is smaller than the first angle.

4. The image sensor of claim 3, wherein the fifth surface is connected to the first surface of the substrate.

5. The image sensor of claim 4, wherein a distance from the fifth surface to the floating diffusion region at the first surface in the first direction is closer than a distance from the third surface of the first extending part to the floating diffusion region at the bottom of the first extending part in the first direction.

6. The image sensor of claim 4, wherein the first extending part further comprises a sixth surface connecting the third surface and the fifth surface.

7. The image sensor of claim 1, further comprising a second extending part extending from the first surface into the substrate, wherein the second extending part is spaced apart from the first extending part in a second direction different from the first direction.

8. The image sensor of claim 7, wherein a distance from a bottom of the second extending part from the second surface in a third direction is substantially same as a distance from the bottom of the first extending part from the second surface in the third direction, and wherein the third direction is perpendicular to the first direction and the second direction.

9. The image sensor of claim 8, wherein each unit pixel region further comprises a pixel separation pattern, and wherein the pixel separation pattern is connected to the second surface of the substrate and is spaced apart from the first surface of the substrate.

10. The image sensor of claim 8, wherein each unit pixel region further comprises a pixel separation pattern, and wherein the pixel separation pattern is connected to the second surface of the substrate and the first surface of the substrate.

11. The image sensor of claim 10, further comprising a second connection part spaced apart from the first connection part in the second direction, wherein the second connection part is connected to the second extending part.

12. An image sensor comprising:

a substrate including a first surface and a second surface opposite to the first surface;

a first unit pixel region provided in the substrate, wherein the first unit pixel region includes a photoelectric conversion layer, a floating diffusion region, and a transfer gate electrode;

a second unit pixel region;

a pixel separation pattern between the first unit pixel region and the second unit pixel region; and a microlens on the second surface of the substrate, wherein the transfer gate electrode comprises a first extending part extending from the first surface into the substrate and a second extending part extending from the first surface into the substrate, wherein the first extending part comprises a third surface and a fourth surface facing the third surface, wherein the third surface has a first angle with respect to the first surface of the substrate and the fourth surface has a second angle with respect to the first surface of the substrate, wherein the second extending part comprises a fifth surface and a sixth surface facing the fifth surface, wherein the fifth surface has a third angle with respect to the first surface of the substrate and the sixth surface has a fourth angle with respect to the first surface of the substrate, wherein the first angle is different from the second angle, and wherein the third angle is different from the fourth angle.

13. The image sensor of claim 12, wherein the fourth surface, the third surface, and the floating diffusion region are sequentially disposed in a first direction parallel to the first surface of the substrate, and wherein the sixth surface, the fifth surface, and the floating diffusion region are sequentially disposed in a second direction perpendicular to the first direction.

14. The image sensor of claim 13, wherein the first angle is greater than the second angle, and wherein the third angle is greater than the fourth angle.

15. The image sensor of claim 14, wherein the pixel separation pattern is connected to the second surface of the substrate and the first surface of the substrate.

16. The image sensor of claim 14, wherein the first extending part has a first width at a bottom of the first extending part in the first direction, a second width at a middle of the first extending part in the first direction, and a third width at a top of the first extending part in the first direction, wherein the bottom of the first extending part is a closest part among the first extending part from the second surface of the substrate in a third direction perpendicular to the first direction, wherein the top of the first extending part is connected to the first surface of the substrate, wherein the middle of the first extending part is between the bottom of the first extending part and the top of the first extending part in the third direction, wherein the second width is greater than the first width, and wherein the third width is greater than the second width.

17. The image sensor of claim 16, further comprising a first connection part and a second connection part, wherein the first connection part is connected to the first extending part, and wherein the second connection part is connected to the second extending part.

18. The image sensor of claim 17, wherein the first connection part is connected to the second connection part.

* * * * *